US012593434B2

(12) United States Patent
Chae et al.

(10) Patent No.: US 12,593,434 B2
(45) Date of Patent: Mar. 31, 2026

(54) METHOD OF FORMING CAPACITOR AND METHOD OF MANUFACTURING DRAM ELEMENT BY USING THE SAME

(71) Applicant: SAMSUNG ELECTRONICS CO., LTD., Suwon-si (KR)

(72) Inventors: Jimin Chae, Suwon-si (KR); Younglim Park, Suwon-si (KR); Dongmin Shin, Suwon-si (KR); Jaesoon Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 513 days.

(21) Appl. No.: 18/121,683

(22) Filed: Mar. 15, 2023

(65) Prior Publication Data

US 2023/0363135 A1      Nov. 9, 2023

(30) Foreign Application Priority Data

May 4, 2022      (KR) ......................... 10-2022-0055305

(51) Int. Cl.
H10B 12/00               (2023.01)
(52) U.S. Cl.
CPC .................................. H10B 12/033 (2023.02)
(58) Field of Classification Search
CPC ........ H10D 1/042; H10D 1/696; H10D 1/716; H10B 12/03; H10B 12/033
See application file for complete search history.

(56) References Cited

U.S. PATENT DOCUMENTS

| | | | |
|---|---|---|---|
| 10,964,614 | B2 | 3/2021 | Lee et al. |
| 2021/0134804 | A1* | 5/2021 | Jung ................. H01L 21/76897 |
| 2021/0183718 | A1 | 6/2021 | Lee et al. |
| 2021/0391333 | A1 | 12/2021 | Jung et al. |
| 2023/0005922 | A1* | 1/2023 | Jung .................... H10B 12/315 |
| 2023/0225112 | A1* | 7/2023 | Park ....................... H10D 1/694 |

FOREIGN PATENT DOCUMENTS

| | | |
|---|---|---|
| CN | 108336068 A | 7/2018 |
| KR | 10-2020-0114865 A | 10/2020 |
| KR | 10-2022-0037041 A | 3/2022 |

* cited by examiner

*Primary Examiner* — Zandra V Smith
*Assistant Examiner* — Molly K Reida
(74) *Attorney, Agent, or Firm* — Muir Patent Law, PLLC

(57)          ABSTRACT

A method of forming a capacitor includes forming lower electrodes including a first metal; forming a support layer pattern, which connects outer side walls of the lower electrodes to each other; forming a first interface layer including a first metal oxide having conductivity on the lower electrodes and the support layer pattern; forming a second interface layer including a second metal oxide having conductivity on the first interface layer; diffusing a second metal included in the second interface layer to a lower electrode surface so as to form a first interface structure including at least the first metal and the second metal on the lower electrode surface; completely removing at least the second interface structure formed on the support layer pattern through an etching process; forming a dielectric layer on the first interface structure and the support layer pattern; and forming an upper electrode on the dielectric layer.

20 Claims, 23 Drawing Sheets

220      204a   240

220      204a 242 240

METHOD OF FORMING CAPACITOR AND METHOD OF MANUFACTURING DRAM ELEMENT BY USING THE SAME

CROSS-REFERENCE TO RELATED APPLICATION

This application claims priority under 35 USC § 119 to Korean Patent Application No. 10-2022-0055305, filed on May 4, 2022, in the Korean Intellectual Property Office (KIPO), the entire disclosure of which is incorporated herein by reference.

BACKGROUND

1. Field

Embodiments of the present disclosure relate to a method of forming a capacitor and a method of manufacturing a DRAM element by using the same. More particularly, embodiments of the present disclosure relate to a method of forming a capacitor having a high capacitance and low leakage currents, and a method of manufacturing a DRAM element including the capacitor.

2. Description of the Related Art

A dynamic random access memory (DRAM) element may be configured such that a transistor and a capacitor are included in a memory cell. The capacitor may have a high capacitance and low leakage currents.

SUMMARY

According to embodiments of the present disclosure, a method of manufacturing a capacitor may include forming lower electrodes including a first metal; forming a support layer pattern, which connects outer side walls of the lower electrodes to each other; forming a first interface layer including a first metal oxide having conductivity on the lower electrodes and the support layer pattern; forming a second interface layer including a second metal oxide having conductivity on the first interface layer; diffusing a second metal included in the second interface layer to a lower electrode surface so as to form a first interface structure including at least the first metal and the second metal on the lower electrode surface, in which the first interface layer and the second interface layer are converted into a second interface structure; completely removing at least the second interface structure formed on the support layer pattern through an etching process; forming a dielectric layer on the first interface structure and the support layer pattern; and forming an upper electrode on the dielectric layer.

According to other embodiments of the present disclosure, a method of manufacturing a capacitor may include forming a lower structure on a substrate; forming an etch stop layer on the lower structure; forming a lower electrode including a first metal on the lower structure through the etch stop layer; forming a first interface layer including a first metal oxide having conductivity on the lower electrode and the etch stop layer; forming a second interface layer including a second metal oxide having conductivity on the first interface layer; diffusing a second metal included in the second interface layer to a lower electrode surface so as to form a first interface structure including at least the first metal and the second metal on the lower electrode surface, in which the first interface layer and the second interface layer are converted into a second interface structure; completely removing at least the second interface structure formed on the etch stop layer through an etching process; forming a dielectric layer on the first interface structure and the etch stop layer; and forming an upper electrode on the dielectric layer.

According to yet other embodiments of the present disclosure, a method of manufacturing a DRAM element may include forming transistors including a gate structure, a first impurity region, and a second impurity region on a substrate; forming bit line structures, which are electrically connected to the first impurity region; forming an interlayer insulating layer, which covers the transistors and the bit line structures, on the substrate; forming contact structures connected to the second impurity region within the interlayer insulating layer; forming an etch stop layer on the interlayer insulating layer and the contact structures; forming lower electrodes, each including a first metal, on the contact structures through the etch stop layer; forming an interface layer having a stacked structure of at least a titanium oxide layer and a niobium oxide layer on the lower electrodes and the etch stop layer; diffusing niobium included in the interface layer to a lower electrode surface so as to form a first interface structure including at least the first metal and the niobium on the lower electrode surface, in which the interface layer is converted into a second interface structure; completely removing at least the second interface structure formed on the etch stop layer through an etching process; forming a dielectric layer on the first interface structure and the etch stop layer; and forming an upper electrode on the dielectric layer.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
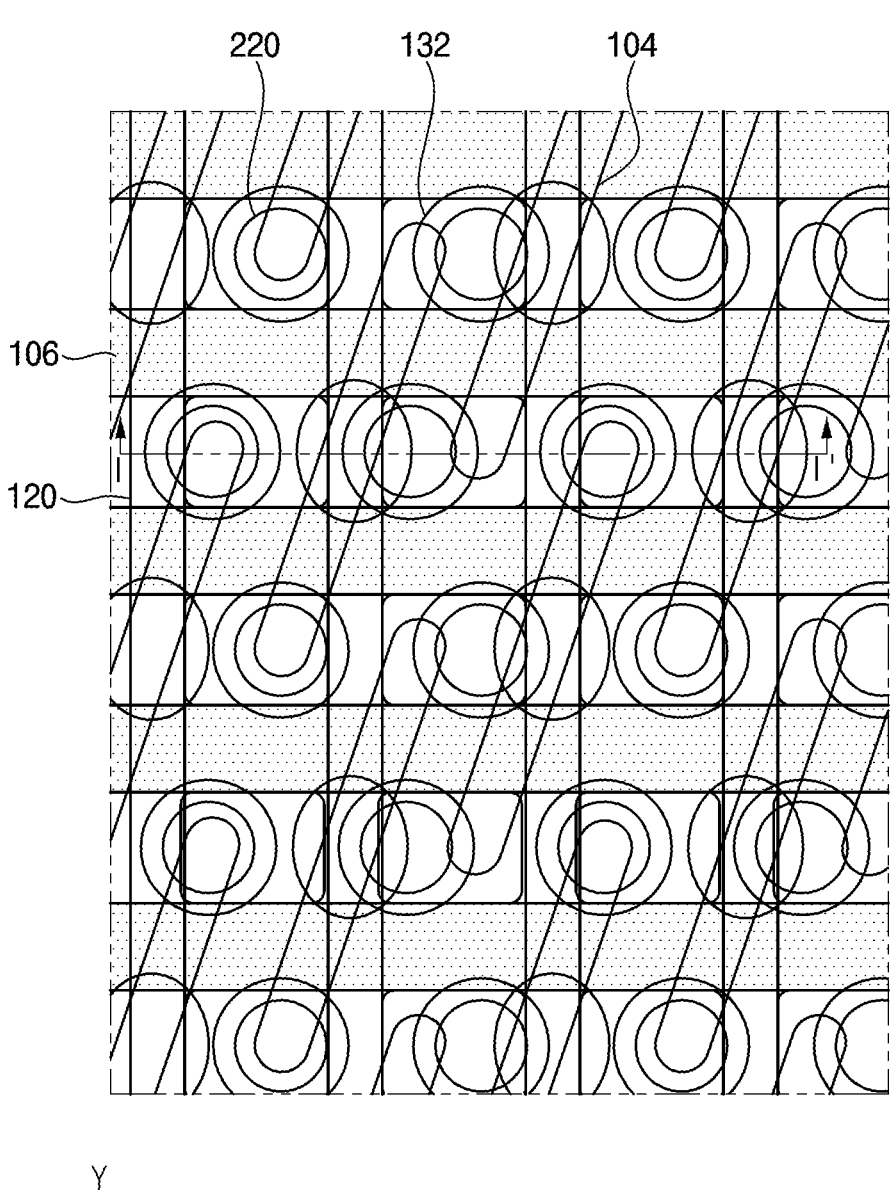
FIG. 1 is a plan view showing a layout of a DRAM element according to exemplary embodiments.
Figure 2:
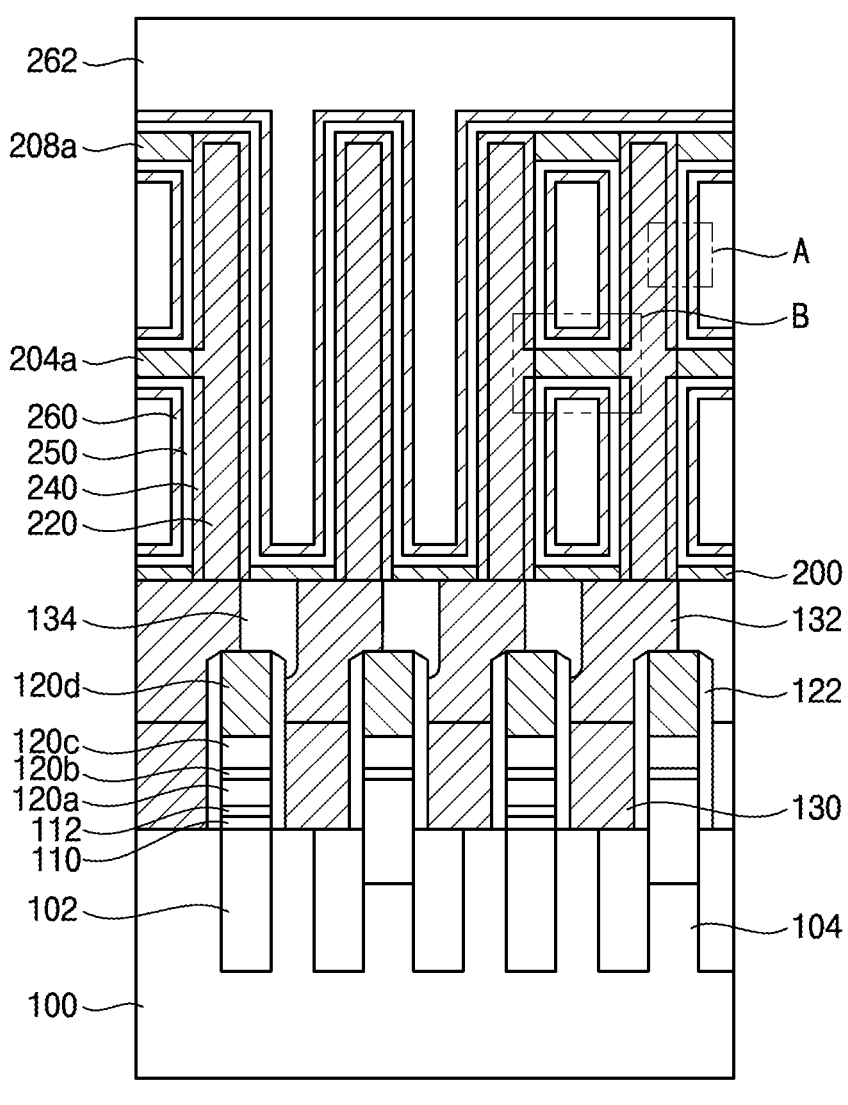
FIG. 2 is a sectional view showing the DRAM element according to the exemplary embodiments.
Figure 3:
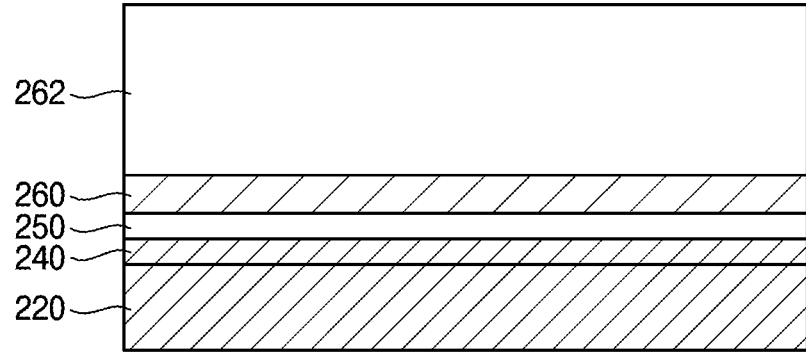
FIG. 3 is an enlarged sectional view showing a portion of a capacitor in the DRAM element according to the exemplary embodiments.
Figure 4A:
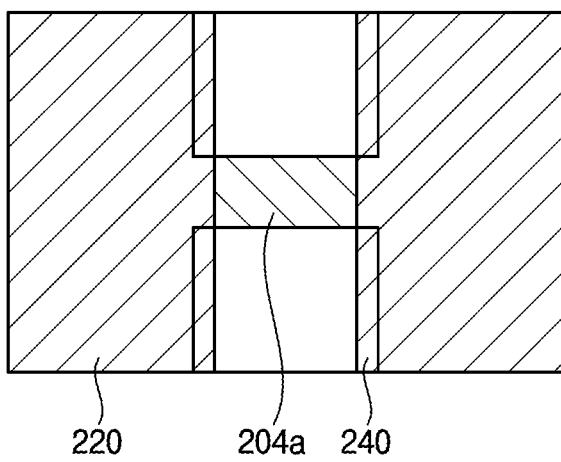
FIGS. 4A and 4B are enlarged sectional views showing portions of capacitors in DRAM elements according to exemplary embodiments, respectively.
Figure 4B:
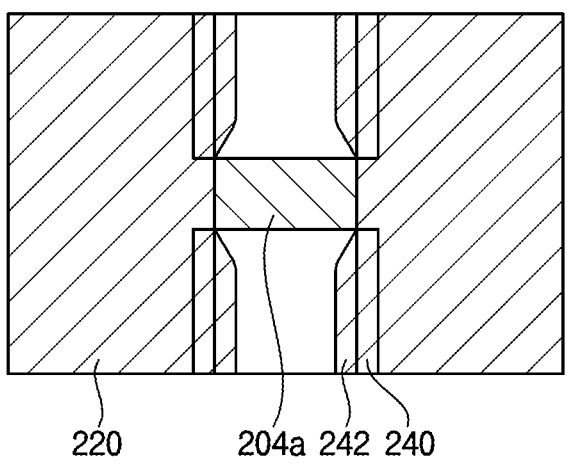

FIG. 1 is a plan view showing a layout of a DRAM element according to exemplary embodiments. FIG. 2 is a sectional view showing the DRAM element according to the exemplary embodiments. FIG. 3 is an enlarged sectional view showing a portion of a capacitor in the DRAM element according to the exemplary embodiments. FIGS. 4A and 4B are enlarged sectional views showing portions of capacitors in DRAM elements according to exemplary embodiments, respectively.

FIG. 2 is a sectional view taken along line I-I' of FIG. 1. In order to simplify illustration, a structure formed on a lower electrode of a capacitor is not shown in FIG. 2. FIG. 3 is an enlarged sectional view showing region A of FIG. 2 (FIG. 3 is rotated counter-clockwise relative to the structure in FIG. 2 to show a horizontal configuration rather than a vertical configuration). FIGS. 4A and 4B are enlarged sectional views showing region B of FIG. 2. FIGS. 4A and 4B show a lower electrode region in contact only with a support layer pattern and an interface structure (i.e., without the dielectric layer and the upper electrode), in order to simplify illustration.

Referring to FIGS. 1 and 2, a dynamic random access memory (DRAM) element may be formed on a substrate 100.

For example, the substrate 100 may be a wafer including silicon, germanium, silicon-germanium, or a group III-V compound, e.g., GaP, GaAs, or GaSb. According to some exemplary embodiments, the substrate 100 may be a silicon-on-insulator (SOI) wafer or a germanium-on-insulator (GOI) wafer.

The DRAM element may include selection transistors, capacitors, and a bit line structure 120. A unit memory cell of the DRAM element may include one selection transistor and one capacitor.

An isolation layer 102 may be provided on the substrate 100. The substrate 100 between the isolation layers 102 may be defined as an active region 104.

A gate trench extending in a first direction X that is parallel to a top surface of the substrate 100 may be provided on the substrate 100. A gate structure 106 may be provided inside the gate trench.

According to an exemplary embodiment, the gate structure 106 may include a gate insulating layer, a gate electrode, and a capping insulating pattern. The gate structure 106 may extend in the first direction X. A plurality of gate structures 106 may be spaced apart from each other in a second direction Y that is parallel to a surface of the substrate 100 and perpendicular to the first direction X.

First and second impurity regions serving as source/drain regions may be provided on an upper portion of the active region 104 between the gate structures 106. The gate structure 106 and the first and second impurity regions may serve as a selection transistor.

A first insulating pattern 110 and a second insulating pattern 112 may be stacked on the active region 104, the isolation layer 102, and the gate structure 106. For example, the first insulating pattern 110 may include an oxide, e.g., a silicon oxide, and the second insulating pattern 112 may include a nitride, e.g., a silicon nitride.

A recess may be included in a partial region of the substrate 100 on which the first insulating pattern 110 and the second insulating pattern 112 are not formed. A top surface of the first impurity region may be exposed on a bottom surface of the recess.

A bit line structure 120 may be provided on the second insulating pattern 112 and the recess. The bit line structure 120 may include a conductive pattern 120*a*, a barrier metal pattern 120*b*, a metal pattern 120*c*, and a hard mask pattern 120*d*. The conductive pattern 120*a* may include, e.g., polysilicon doped with impurities. The bit line structure 120 may extend in the second direction, and a plurality of bit line structures 120 may be spaced apart from each other in the first direction. According to exemplary embodiments, a spacer 122 may be provided on a side wall of the bit line structure 120, e.g., the spacer may have a structure in which a plurality of spacers are laterally stacked. Further, a first interlayer insulating layer filling a gap between the bit line structures 120 may be provided.

A contact plug 130 and a landing pad 132, which pass through the first interlayer insulating layer, the second insulating pattern 112, and the first insulating pattern 110 to contact the second impurity region, may be provided. The contact plug 130 may be disposed between the bit line structures 120. The landing pad 132 may be formed on the contact plug 130. An insulating pattern 134 may be provided between the landing pads 132.

An etch stop layer 200 may be provided on the landing pad 132, the insulating pattern 134, and the first interlayer insulating layer. A capacitor passing through the etch stop layer 200 and contacting the landing pad 132 may be provided. The etch stop layer 200 may include, e.g., a silicon nitride, a silicon oxynitride, and the like.

The capacitor may include a lower electrode 220, a first interface structure 240, a dielectric layer 250, and an upper electrode 260. Additionally, a lower support layer pattern 204*a* and an upper support layer pattern 208*a* may be provided on a side wall of the lower electrode 220. In addition, a plate electrode 262 may be provided on the upper electrode 260.

The lower electrode 220 may have a cylindrical, e.g., pillar, shape. The lower electrode 220 may pass through the etch stop layer 200 to, e.g., directly, contact the landing pad 132.

The lower electrode 220 may include a first metal. According to the exemplary embodiment, the lower electrode 220 may include a titanium nitride. In some exemplary embodiments, the lower electrode 220 may include a metal, e.g., Ti, W, Ni, or Co, or a metal nitride, e.g., TiSiN, TiAlN, TaN, TaSiN, or WN.

The lower support layer pattern 204*a* may support and connect outer side walls of a center portion of the lower electrode 220 to each other. The upper support layer pattern 208*a* may support and connect outer side walls of an upper portion of the lower electrode 220 to each other. The lower support layer pattern 204*a* and the upper support layer pattern 208*a* may include an insulating material, e.g., a silicon nitride, a silicon oxynitride, and the like.

In some exemplary embodiments, only one of the lower and upper support layer patterns may be provided. In some exemplary embodiments, the lower support layer pattern and the upper support layer pattern may not be provided.

The first interface structure 240 may be formed, e.g., directly, on the lower electrode 220. The first interface structure 240 may not be formed on top and bottom surfaces, e.g., surfaces parallel to a top surface of the substrate 100, of the lower support layer pattern 204*a*, the upper support layer pattern 208*a*, and the etch stop layer 200. The first interface structure 240 may be located inwardly from a surface on which the lower electrode 220 contacts the lower support layer pattern 204*a* and a surface of a region in which the lower electrode 220 contacts the upper support layer pattern 208a. For example, as illustrated in FIG. 2, the first interface structure 240 may be horizontally offset from a surface of the lower support layer pattern 204a that faces the lower electrode 220, e.g., so the first interface structure 240 may not overlap bottom and top surfaces of the lower support layer pattern 204a.

For example, as shown in FIG. 4A, the first interface structure 240 may have a substantially uniform thickness. For example, as further shown in FIG. 4A, the first interface structure 240 may have a same thickness as a protrusion extending from the lower electrode 220, so lateral surfaces of the first interface structure 240 and of the protrusion extending from the lower electrode 220 may be coplanar, e.g., so the first interface structure 240 and the lower support layer pattern 204a may not overlap vertically or horizontally.

In another example, as shown in FIG. 4B, a second interface structure 242 may be further included on the first interface structure 240. The second interface structure 242 may be formed of substantially the same material as the first interface structure 240. The second interface structure 242 formed at a periphery of the etch stop layer 200, the upper support layer pattern 208a, and the lower support layer pattern 204a may have a relatively thin thickness.

The first interface structure 240 may include the first metal included in the lower electrode 220, a second metal that is not included in the lower electrode 220, oxygen, and nitrogen. Since the second metal is included in the first interface structure 240, a capacitance of the capacitor may be increased. For example, the second metal may include niobium. In another example, the second metal may include tantalum, tungsten, cobalt, Sn, or indium. For example, the first interface structure 240 may be a material including titanium (i.e., the first metal), niobium (i.e., the second metal), oxygen, and nitrogen.

A concentration of the second metal in the first interface structure 240 may be at least than 10% (atomic %), e.g., about 10% to about 30%. For example, a concentration of niobium included in the first interface structure 240 may be greater than 10%. When the second metal (e.g., niobium) is included in the first interface structure 240 in an amount greater than 10%, based on a total composition of the first interface structure 240, the capacitance of the capacitor that will be formed in a subsequent process may be increased.

The first interface structure 240 may have a thickness of about 5 angstroms to about 15 angstroms, e.g., about 10 angstroms. When the first interface structure 240 is thinner than 5 angstroms, an increase in the capacitance may be small. When the first interface structure 240 is thicker than 15 angstroms, the concentration of the second metal in the first interface structure 240 may be reduced.

The dielectric layer 250 may be conformally formed along outer surfaces of the first interface structure 240, the lower support layer pattern 204a, the upper support layer pattern 208a, and the etch stop layer 200. The dielectric layer 250 may include a metal oxide. The dielectric layer 250 may include, e.g., $HfO_2$, $ZrO_2$, $Al_2O_3$, $La_2O_3$, $Ta_2O_3$, and/or $TiO_2$. The dielectric layer 250 may include a single layer or a multi-layer in which at least two layers are stacked. According to the exemplary embodiment, the dielectric layer 250 may be a $HfO_2$ layer, a $ZrO_2$ layer, or a multi-layer in which the $HfO_2$ layer and the $ZrO_2$ layer are stacked.

The first interface structure 240 may make direct contact with the dielectric layer 250, e.g., the first interface structure 240 may completely separate between the lower electrode 220 and the dielectric layer 250. When the dielectric layer 250 makes direct contact with the first interface structure 240 including metals of mutually different materials, oxygen, and nitrogen, as described above, the capacitance may become higher, as compared with a case in which the dielectric layer 250 makes direct contact with the lower electrode 220. In addition, leakage currents of the capacitor may be reduced. Meanwhile, the dielectric layer 250 may make direct contact with the lower support layer pattern 204a, the upper support layer pattern 208a, and the etch stop layer 200.

The upper electrode 260 may be formed on the dielectric layer 250. The upper electrode 260 may include, e.g., a titanium nitride ($TiN_x$), titanium (Ti), tantalum (Ta), a tantalum nitride ($TaN_x$), ruthenium (Ru), tungsten, and a tungsten nitride.

The plate electrode 262 may be formed on the upper electrode 260. The plate electrode 262 may include polysilicon.

Since the capacitor includes the first interface structure 240, e.g., between the lower electrode 220 and the dielectric layer 250, such that the first interface structure 240 does not vertically overlap top and bottom surfaces of the lower and upper support layer patterns 204a and 208, the capacitance of the capacitor may be increased. Further, leakage currents of the capacitor may be reduced.

Figure 5A:
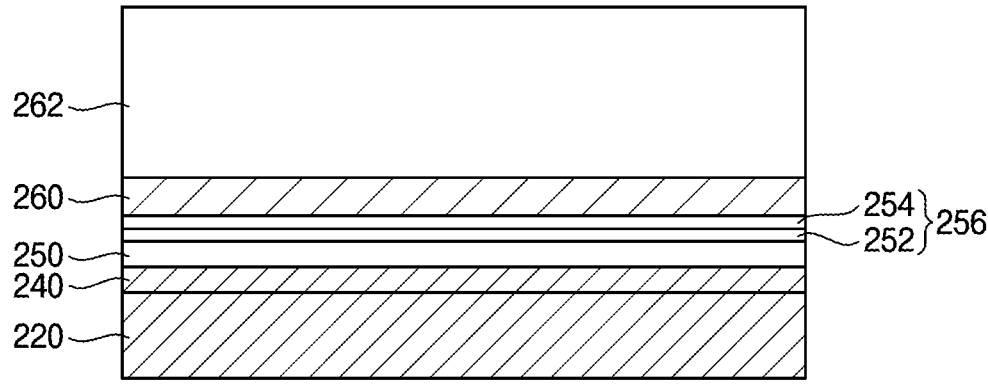
FIG. 5A is an enlarged sectional view showing a portion of a capacitor in the DRAM element according to the exemplary embodiments.

FIG. 5A is an enlarged sectional view showing a portion of a capacitor in the DRAM element according to the exemplary embodiments. The capacitor shown in FIG. 5A may be the same as the capacitor described with reference to FIGS. 1 to 4B, except that an upper interface structure is further included between the dielectric layer 250 and the upper electrode 260.

Referring to FIG. 5A, the capacitor may include the lower electrode 220, the first interface structure 240, the dielectric layer 250, an upper interface structure 256, and the upper electrode 260. Additionally, although not shown, the lower support layer pattern 204a and the upper support layer pattern 208a may be provided on a side wall of the lower electrode 220. In addition, the plate electrode 262 may be provided on the upper electrode 260.

The upper interface structure 256 may include a first upper interface layer 252 including a first metal oxide having conductivity, and a second upper interface layer 254 including a second metal oxide having conductivity. At least one of the first and second upper interface layers 252 and 254 may include a metal that is different from a metal included in the upper electrode that will be subsequently formed. The metal included in the at least one of the first and second upper interface layers 252 and 254 may include, e.g., niobium, tantalum, tungsten, cobalt, Sn, or indium.

According to the exemplary embodiment, the upper interface structure 256 may have a stacked structure of a titanium oxide layer and a niobium oxide layer. In some exemplary embodiments, the upper interface structure 256 may have a stacked structure of a niobium oxide layer and a titanium oxide layer.

Figure 5B:
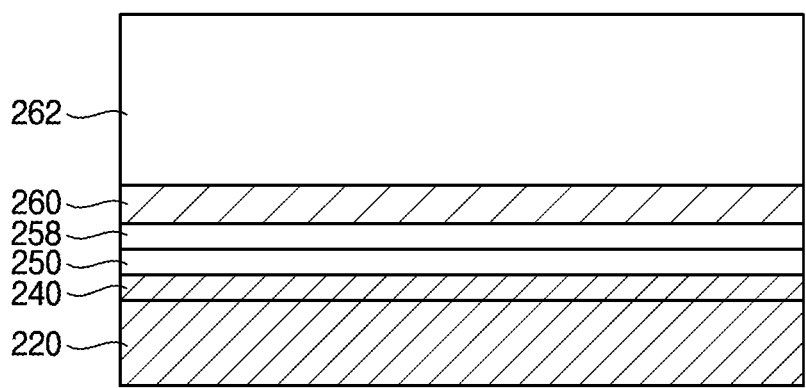
FIG. 5B is an enlarged sectional view showing a portion of a capacitor in a DRAM element according to exemplary embodiments.

FIG. 5B is an enlarged sectional view showing a portion of a capacitor in a DRAM element according to exemplary embodiments. The capacitor shown in FIG. 5B may be the same as the capacitor described with reference to FIGS. 1 to 4B, except that an upper interface layer is further included between the dielectric layer 250 and the upper electrode 260.

Referring to FIG. 5B, an upper interface layer 258 may include a metal that is different from the metal included in the upper electrode 260, and may include a metal oxide having conductivity.

The metal included in the upper interface layer 258 may be positioned between the dielectric layer 250 and the upper electrode 260. The upper interface layer 258 may include, e.g., niobium, tantalum, tungsten, cobalt, Sn, or indium. According to the exemplary embodiment, the upper interface layer 258 may be a niobium oxide layer.

FIGS. 6 to 16 are sectional views of stages in a method of manufacturing a capacitor according to an exemplary embodiment.

Figure 6:
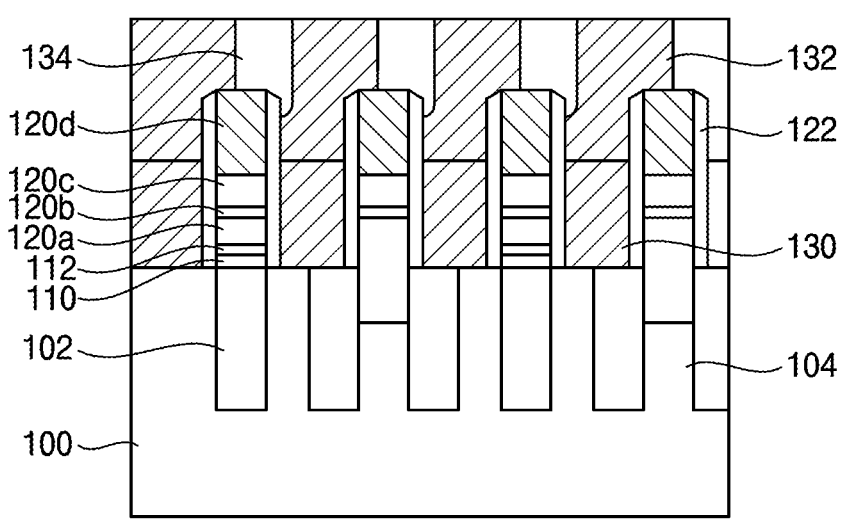
FIGS. 6 to 16 are sectional views of stages in a method of manufacturing a capacitor according to an exemplary embodiment.

Referring to FIG. 6, a shallow trench isolation (STI) process may be performed on the substrate 100 to form the isolation layer 102. Therefore, the substrate 100 may be divided into an element separation region in which the isolation layer 102 is formed between the active regions 104.

Upper portions of the substrate 100 and the isolation layer 102 may be etched to form a gate trench extending in the first direction. A gate structure may be formed inside the gate trench. First and second impurity regions may be formed in the active regions 104 on both sides of the gate structure, respectively.

The first insulating pattern 110 and the second insulating pattern 112 may be formed on the active regions 104, the isolation layer 102, and the gate structure. A recess may be formed in a portion of the substrate 100 on which the first insulating pattern 110 and the second insulating pattern 112 are not formed. A top surface of the first impurity region may be exposed on a bottom surface of the recess.

The bit line structure 120 extending in the second direction may be formed on the second insulating pattern 112 and the recess. The bit line structure 120 may have a stacked structure of the conductive pattern 120a, the barrier metal pattern 120b, the metal pattern 120c, and the hard mask pattern 120d. According to exemplary embodiments, the spacer 122 may be formed on a side wall of the bit line structure 120.

A first interlayer insulating layer covering the bit line structures 120 may be formed. A portion of the first interlayer insulating layer between the bit line structures 120 may be etched to form a contact hole exposing the second impurity region of the substrate. The contact plug 130 and the landing pad 132 may be formed to fill the contact hole. the insulating pattern 134 may be formed between the landing pads 132. The landing pad 132 may be electrically connected to the second impurity region.

Figure 7:
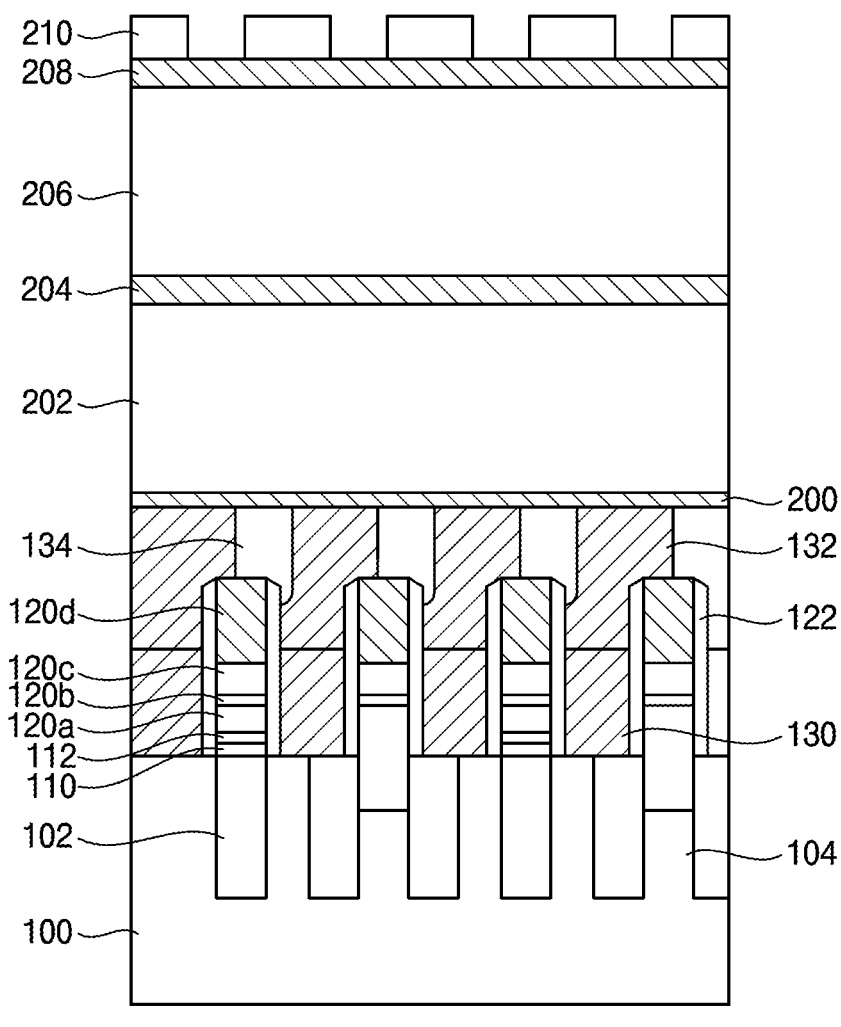

Referring to FIG. 7, the etch stop layer 200 may be formed on the landing pad 132 and the insulating pattern 134. The etch stop layer 200 may include, e.g., a silicon nitride, a silicon oxynitride, and the like.

A lower mold layer 202, a lower support layer 204, an upper mold layer 206, and an upper support layer 208 may be sequentially stacked on the etch stop layer 200. The lower mold layer 202 and the upper mold layer 206 may include an insulating material having an etching selectivity with respect to the lower support layer 204 and the upper support layer 208. For example, the lower mold layer 202 and the upper mold layer 206 may include a silicon oxide, and the lower support layer 204 and the upper support layer 208 may include a silicon nitride or a silicon oxynitride.

A capacitor mask pattern 210 may be formed on the upper support layer 208. The capacitor mask pattern 210 may include holes exposing regions in which lower electrodes are to be formed. The capacitor mask pattern 210 may include amorphous carbon or polysilicon.

In some exemplary embodiments, one of the lower and upper support layers 204 and 208 may not be formed. In some exemplary embodiments, neither the lower support layer 204 nor the upper support layer 208 may be formed.

Figure 8:
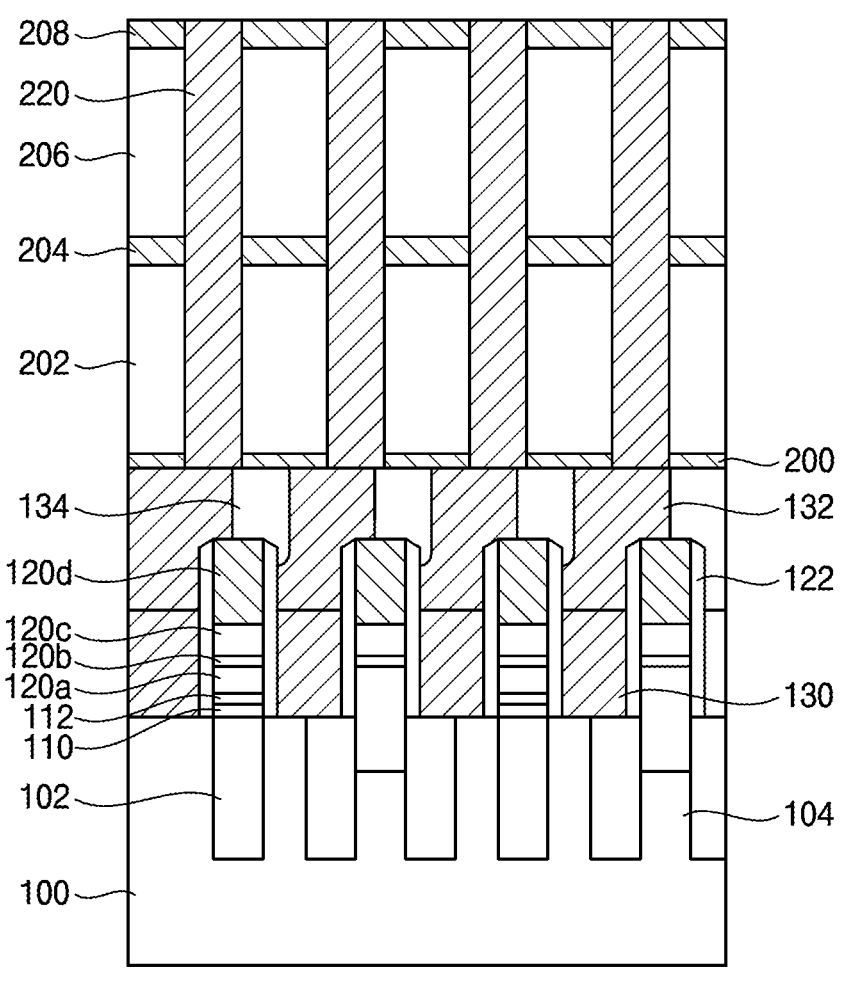

Referring to FIG. 8, the upper support layer 208, the upper mold layer 206, the lower support layer 204, the lower mold layer 202, and the etch stop layer 200 may be etched by using the capacitor mask pattern 210 as an etching mask to form a first hole. The etching process may include an anisotropic etching process.

Thereafter, a lower electrode layer may be formed to fill the first holes, and the lower electrode layer may be planarized to expose a top surface of the upper support layer 208. Therefore, the lower electrodes 220 may be formed in the first holes.

The lower electrode 220 may include a first metal. According to the exemplary embodiment, the lower electrode 220 may include a metal, e.g., Ti, W, Ni, or Co or a metal nitride, e.g., TiN, TiSiN, TiAlN, TaN, TaSiN, or WN. For example, the lower electrode 220 may include a titanium nitride.

Figure 9:
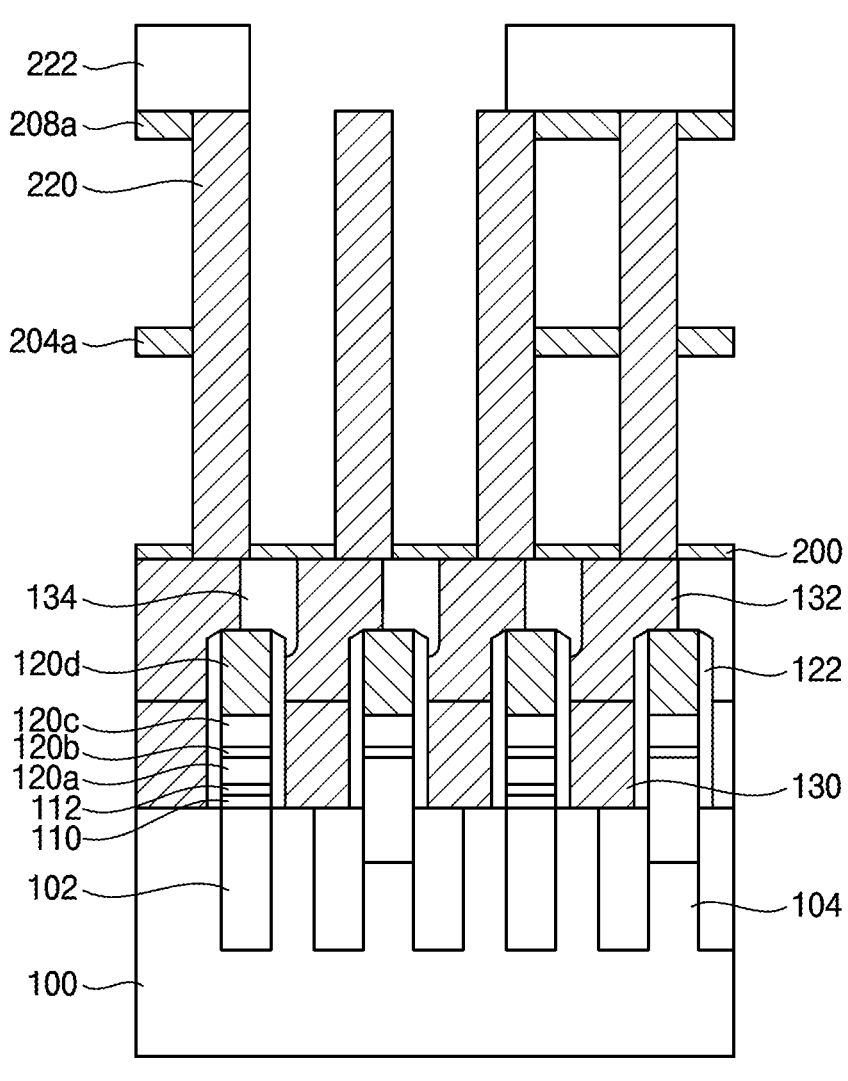

Referring to FIG. 9, a first mask pattern 222 may be formed on the upper support layer 208 and the lower electrode 220. The first mask pattern 222 may include amorphous carbon or polysilicon.

The upper support layer 208 may be etched by using the first mask pattern 222 as an etching mask to form the upper support layer pattern 208a. The etching process may include an anisotropic etching process, and may include, e.g., a dry etching process. The upper support layer pattern 208a may include first openings.

Thereafter, the upper mold layer 206 may be removed. The removal process may include an isotropic etching process, and may include, e.g., a wet etching process. For example, when the upper mold layer 206 includes a silicon oxide, the etching process may be performed by using an etchant including HF, $NH_4F$, and the like.

The lower support layer 204 may be etched by using the first mask pattern 222 to form the lower support layer pattern 204a. The etching process may include an anisotropic etching process, and may include, e.g., a dry etching process.

The lower support layer pattern 204a may have substantially the same shape as the upper support layer pattern 208a. The lower support layer pattern 204a may include second openings. The second openings may be located at the same positions as the first openings, respectively, e.g., the first and second openings may vertically overlap each other.

Thereafter, the lower mold layer 202 may be removed. The removal process may include an isotropic etching process, e.g., a wet etching process. For example, when the lower mold layer 202 includes a silicon oxide, the etching process may be performed by using an etchant including HF, $NH_4F$, and the like.

Next, the first mask pattern 222 may be removed. When the above process is performed, the lower support layer pattern 204a and the upper support layer pattern 208a, which support the lower electrode 220, may be formed.

Figure 10:
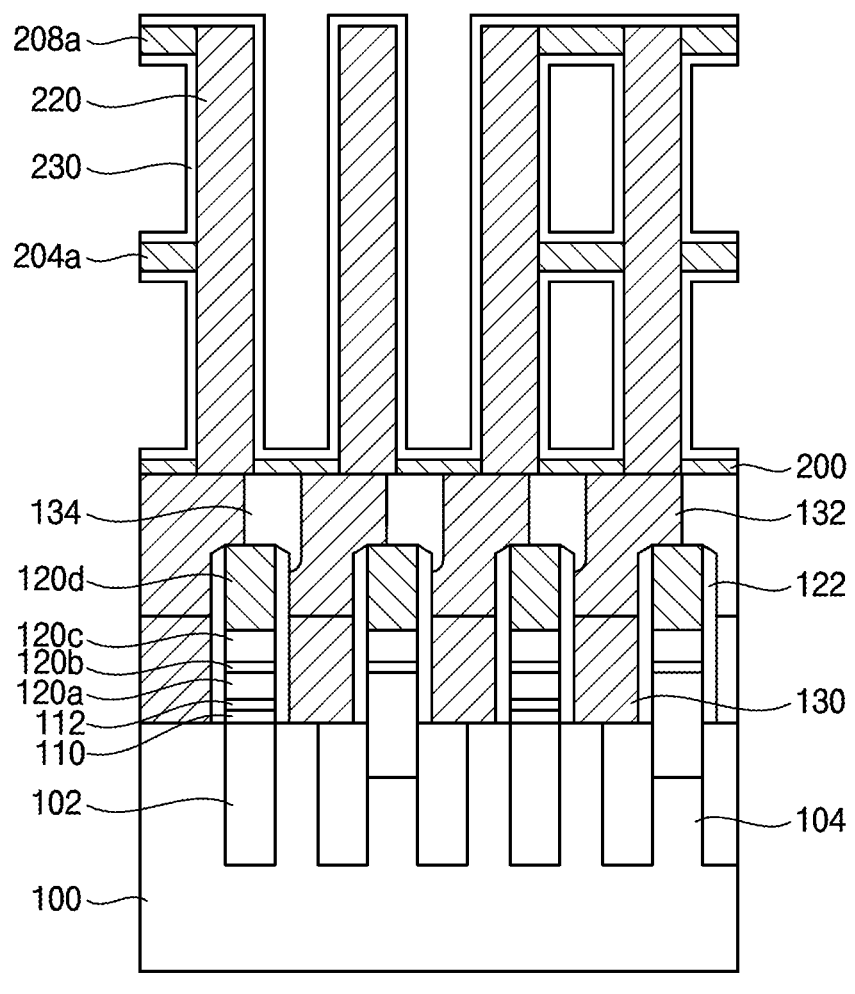

Referring to FIG. 10, a first interface layer 230 may be conformally, e.g., and continuously, formed along surfaces of the etch stop layer 200, the lower electrode 220, the lower support layer pattern 204a, and the upper support layer pattern 208a. The first interface layer 230 may include a metal oxide having conductivity. The first interface layer 230 may include a material having a higher etching rate than a second interface layer that will be formed in a subsequent process when the same etching process is performed. Since the first interface layer 230 is formed, a third interface structure that will be formed in a subsequent process may be more easily removed.

According to the exemplary embodiment, the first interface layer 230 may include the same metal material as the metal included in the lower electrode 220 (i.e., the first metal). According to the exemplary embodiment, the first interface layer 230 may include a titanium oxide.

The first interface layer 230 may have a thickness of less than 7 angstroms, e.g., about 3 angstroms to about 7 angstroms. When the first interface layer 230 is thinner than 3 angstroms, the third interface structure may not be easily removed. When the first interface layer 230 is thicker than 7 angstroms, the second interface layer may become relatively thin so that diffusion of a metal included in the second interface layer may be reduced.

The first interface layer 230 may be formed by performing, e.g., an atomic layer deposition scheme, a chemical vapor deposition scheme, a physical vapor deposition scheme, an ion implantation scheme, or the like.

After the first interface layer 230 is formed, a diffusion process for diffusing the metal included in the first interface layer 230 to the lower electrode 220 may be performed. The diffusion process may include, e.g., a plasma treatment process, a heat treatment process, an ultraviolet (UV) treatment process, and the like.

In some exemplary embodiments, the diffusion process may be performed in situ while a deposition process of the first interface layer 230 is performed. In some exemplary embodiments, the diffusion process may not be performed after the first interface layer 230 is formed.

Figure 11:
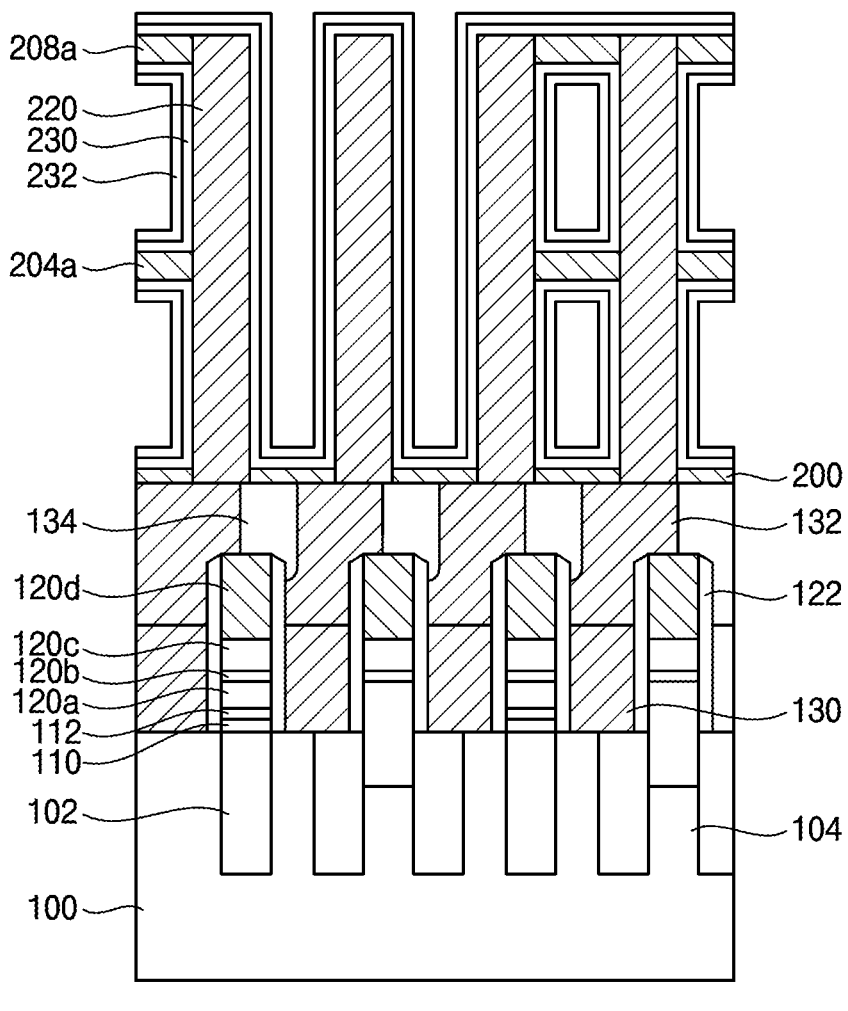

Referring to FIG. 11, a second interface layer 232 may be formed, e.g., conformally and continuously, on the first interface layer 230 along a surface of the first interface layer 230. The second interface layer 232 may include a metal oxide having conductivity, and the metal included in the second interface layer 232 may be referred to as a second metal.

The second interface layer 232 may be provided to diffuse the second metal to a surface of the lower electrode 220. The second metal included in the second interface layer 232 may be a material that is different from the first metal included in the lower electrode 220. The second metal may be a material capable of increasing a capacitance of a capacitor when doped to the lower electrode 220.

According to the exemplary embodiment, the second metal may include niobium. In other words, the second interface layer 232 may be a niobium oxide. In some exemplary embodiments, the second metal may include tantalum, tungsten, cobalt, Sn, or indium, and the second interface layer 232 may be an oxide of the second metal.

The second interface layer 232 may have a thickness of less than 7 angstroms, e.g., a thickness of about 3 angstroms to about 7 angstroms. When the second interface layer 232 is thinner than 3 angstroms, the diffusion of the second metal may be reduced. When the second interface layer 232 is thicker than 7 angstroms, the first interface layer 230 may become relatively thin so that it may be difficult to remove the third interface structure in a subsequent process.

The second interface layer 232 may be formed by performing, e.g., an atomic layer deposition scheme, a chemical vapor deposition scheme, a physical vapor deposition scheme, an ion implantation scheme, or the like.

According to the exemplary embodiment, a sum of the thicknesses of the first and second interface layers 230 and 232 may be less than 10 angstroms, e.g., a thickness of about 6 angstroms to about 10 angstroms. When the sum of the thicknesses of the first and second interface layers 230 and 232 is thinner than 6 angstroms, an amount of the metal diffused to the surface of the lower electrode 220 may become small, and when the sum of the thicknesses of the first and second interface layers 230 and 232 is thicker than 10 angstroms, a degree of integration of the capacitor may be reduced.

Figure 12:
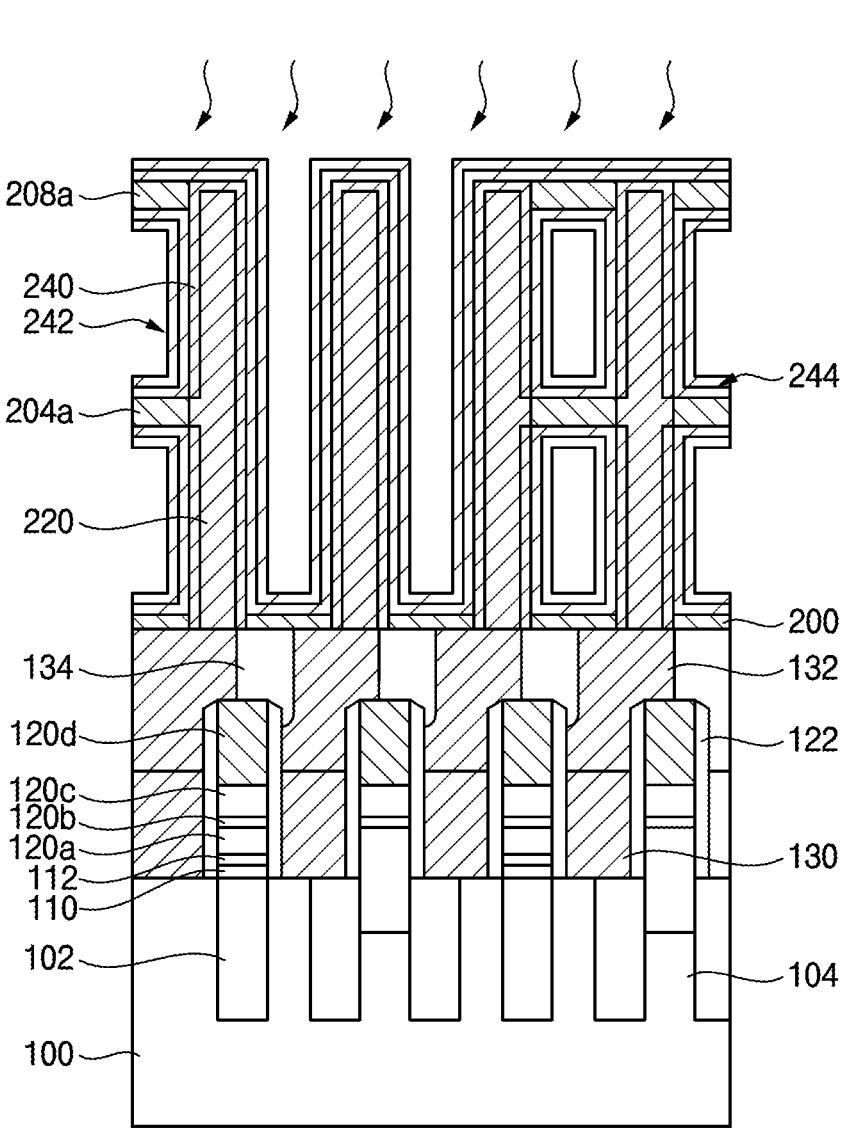

Referring to FIG. 12, after the second interface layer 232 is formed, a diffusion process for diffusing the second metal to the surfaces of the first interface layer 230 and the lower electrode 220 may be performed. The diffusion process may include, e.g., a plasma treatment process, a heat treatment process, an ultraviolet (UV) treatment process, and the like. In some exemplary embodiments, the diffusion process may be performed in situ while a deposition process of the second interface layer 232 is performed.

Through the diffusion process, the second metal (e.g., niobium) may be diffused to the surfaces of the first interface layer 230 and the lower electrode 220 so that the first interface structure 240 including at least the first metal and the second metal may be formed on the surface of the lower electrode 220. The first interface structure 240 may include the first metal (i.e., the metal included in the first interface layer 230), the second metal, oxygen, and nitrogen.

In detail, as titanium, niobium, and oxygen included in the first and second interface layers 230 and 232 diffuse to the surface of the lower electrode 220, the surface of the lower electrode 220 may be converted into the first interface structure 240 including titanium, niobium, nitrogen, and oxygen. For example, referring to FIGS. 11 and 12, a portion of the lower electrode 220 (e.g., from an original outermost surface to a predetermined depth) may be converted into the first interface structure 240 (including titanium, niobium, nitrogen, and oxygen), such that a width of each of the lower electrodes 220 (e.g., of each pillar) along a direction parallel to the upper surface of the substrate 100 may be decrease (as compared to an original width).

In addition, as niobium diffuses to the first interface layer 230, the first and second interface layers 230 and 232 may be converted into the second interface structure 242 including titanium, niobium, and oxygen. The second interface structure 242 may further include nitrogen diffused from the lower electrode 220. Therefore, the first interface structure 240 and the second interface structure 242 may be formed on the lower electrode 220.

Although the first and second interface structures 240 and 242 are distinguished from each other for description, the first and second interface structures 240 and 242 may include substantially the same material, and may not be distinguished from each other (e.g., may be a single layer without a visible interface therebetween).

Meanwhile, the second interface layer 232 formed on the etch stop layer 200, the upper support layer pattern 208a, and the lower support layer pattern 204a may diffuse to the first interface layer 230, but may not further diffuse to a lower portion of the first interface layer 230. That is, in regions where the second interface layer 232 is formed on upper/lower surfaces of the etch stop layer 200, the upper support layer pattern 208a, and the lower support layer pattern 204a, the second interface layer 232 may diffuse only partially into the first interface layer 230 (e.g., without diffusing into the etch stop layer 200, the upper support layer pattern 208a, and the lower support layer pattern 204a). Therefore, the first and second interface layers 230 and 232 formed on the etch stop layer 200, the upper support layer pattern 208a, and the lower support layer pattern 204a may be converted into the third interface structure 244 including titanium, niobium, and oxygen (e.g., without nitrogen). In other words, the third interface structure 244 may be formed on the etch stop layer 200, the upper support layer pattern 208a, and the lower support layer pattern 204a. A sum of thicknesses of the first and second interface structures 240 and 242 may be thicker than the third interface structure 244.

As described above, since the first and second metals are included in the first interface structure 240, the first interface structure 240 may include mutually different metals. When the above process is performed, a concentration of the second metal diffused to the surface of the lower electrode 220 may be increased. The concentration of the second metal in the first interface structure 240 may be greater than 10% (atomic %), e.g., about 10% to about 30%.

According to the exemplary embodiments, a concentration of niobium included in the first interface structure 240 may be greater than 10%. When the second metal (e.g., niobium) is included in the first interface structure 240 in an amount greater than 10%, the capacitance of the capacitor to be formed in a subsequent process may be increased.

The first interface structure 240 may have a thickness of about 5 angstroms to about 15 angstroms. For example, the first interface structure 240 may have a thickness of about 10 angstroms.

Figure 13:
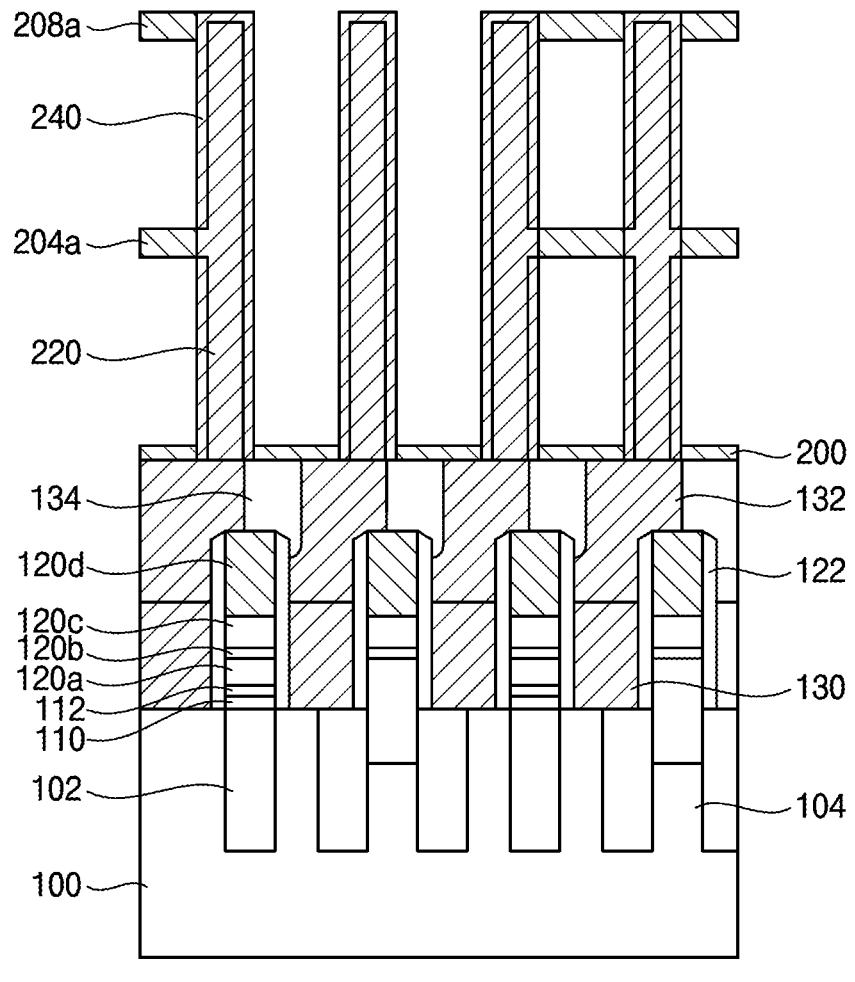
Figure 14:
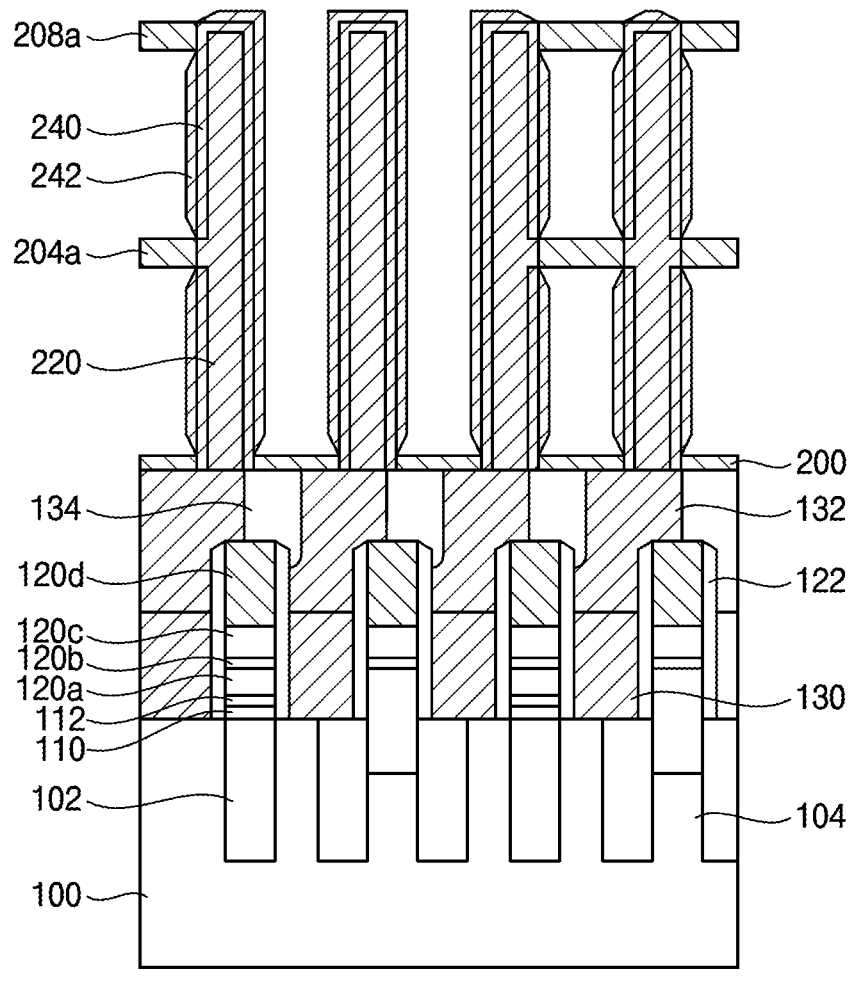

Referring to FIGS. 13 and 14, the third interface structure 244 may be removed through an isotropic etching process.

Since the third interface structure 244 has conductivity, adjacent lower electrodes may be electrically connected to each other by the third interface structure 244. Therefore, the third interface structure 244 has to be completely removed. In a process of removing the third interface structure 244, at least a portion of the second interface structure 242 may be removed together with the third interface structure 244. However, after the removal process is performed, the first interface structure 240 may remain. For example, as shown in FIG. 13, all of the second interface structure 242 may be removed through the removal process.

In another example, as shown in FIG. 14, a portion of the second interface structure may remain after the removal process is performed. Since the second interface structure 242 has superior adhesion properties, as compared with the third interface structure 244, the second interface structure 242 may have a lower etching rate than the third interface structure. Therefore, a portion of the second interface structure 242 may remain. In this case, as shown in FIG. 4B, the second interface structure 242 formed at a periphery of the etch stop layer, the upper support layer pattern, and the lower support layer pattern may have a relatively thin thickness.

The removal process of the third interface structure 244 may include an isotropic etching process. The etching process of the third interface structure 244 may be performed by wet etching, isotropic dry etching, or atomic layer etching. Through the above process, the surfaces of the lower support layer pattern 204a, the upper support layer pattern 208a, and the etch stop layer 200 may be exposed.

Meanwhile, unlike the present embodiment, if a second interface layer were to be formed alone (e.g., without a first interface layer) on the etch stop layer 200, the upper support layer pattern 208a, and the lower support layer pattern 204a, or a composite layer including mutually different metals were to be deposited and formed (e.g., without diffusion of interface layers) on the etch stop layer 200, the upper support layer pattern 208a, and the lower support layer pattern 204a, it would have been very difficult to remove the second interface layer or the composite layer. Therefore, the second interface layer or the composite layer would have remained, thereby causing a bridge defect between the lower electrodes.

In contrast, according to embodiments, the third interface structure 244 formed by first forming the first interface layer 230 having a high etching rate, then sequentially depositing the second interface layer 232 on the first interface layer 230, and finally diffusing the first and second interface layers 230 and 232 may have a high etching rate. As described above, the third interface structure 244 may be completely etched through the isotropic etching process, so that a bridge defect caused when the third interface structure 244 remains may be prevented or substantially reduced.

Figure 15:
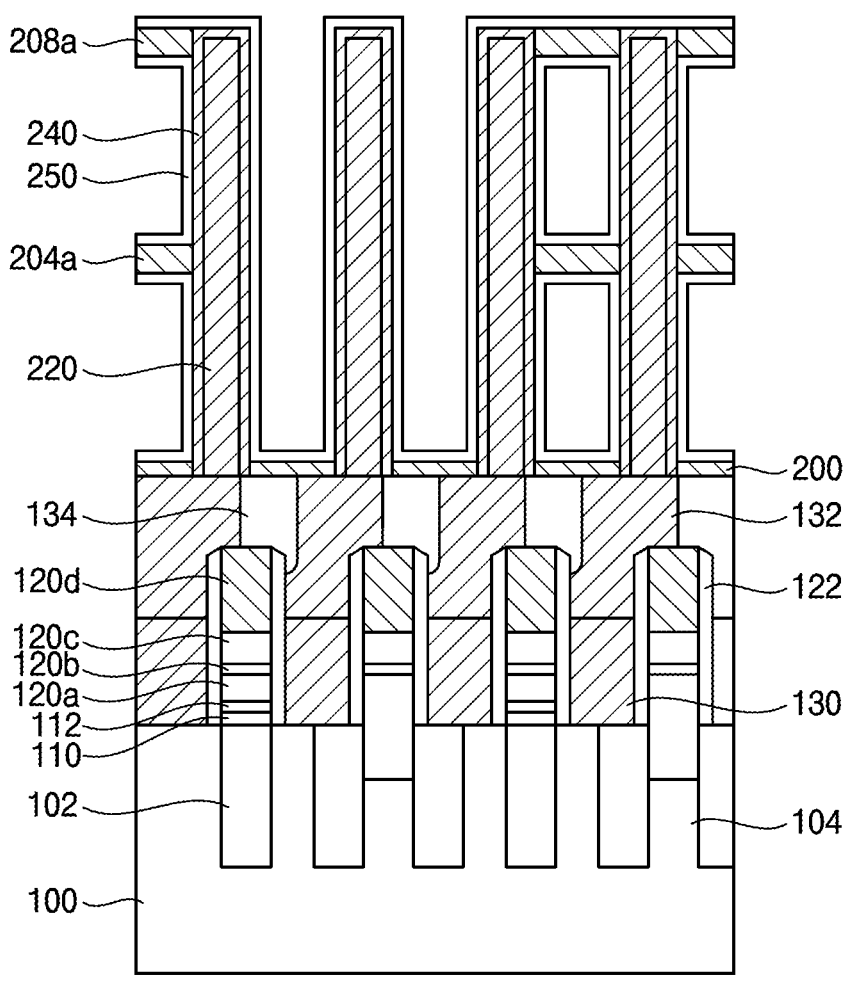

Referring to FIG. 15, the dielectric layer 250 may be formed on the first interface structure 240, the lower support layer pattern 204a, the upper support layer pattern 208a, and the etch stop layer 200. The dielectric layer 250 may include a metal oxide. The dielectric layer 250 may include, e.g., $HfO_2$, $ZrO_2$, $Al_2O_3$, $La_2O_3$, $Ta_2O_3$, and/or $TiO_2$. The dielectric layer 250 may include a single layer or a multi-layer in which at least two layers are stacked. According to the exemplary embodiment, the dielectric layer 250 may be a $HfO_2$ layer, a $ZrO_2$ layer, or a multi-layer in which the $HfO_2$ layer and the $ZrO_2$ layer are stacked. In other words, the dielectric layer 250 may make direct contact with the first interface structure 240. Therefore, the capacitance of the capacitor may be increased.

Figure 16:
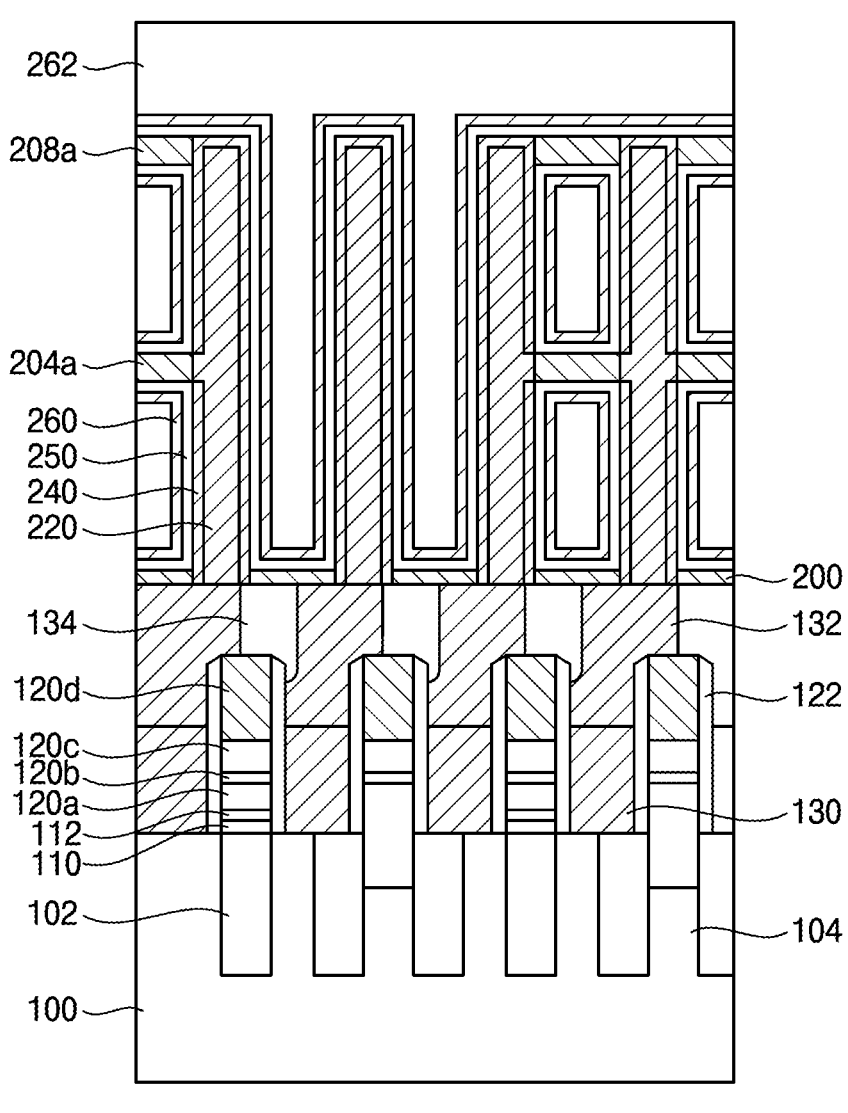

Referring to FIG. 16, the upper electrode 260 may be formed on the dielectric layer 250. The plate electrode 262 may be formed on the upper electrode 260.

The upper electrode 260 may include, e.g., a titanium nitride ($TiN_x$), titanium (Ti), tantalum (Ta), a tantalum nitride ($TaN_x$), ruthenium (Ru), tungsten, and a tungsten nitride. The plate electrode 262 may include, e.g., polysilicon.

Through the above process, a DRAM element having a capacitor including the lower electrode 220, the first interface structure 240, the dielectric layer 250, and the upper electrode 260 may be manufactured.

Figure 17:
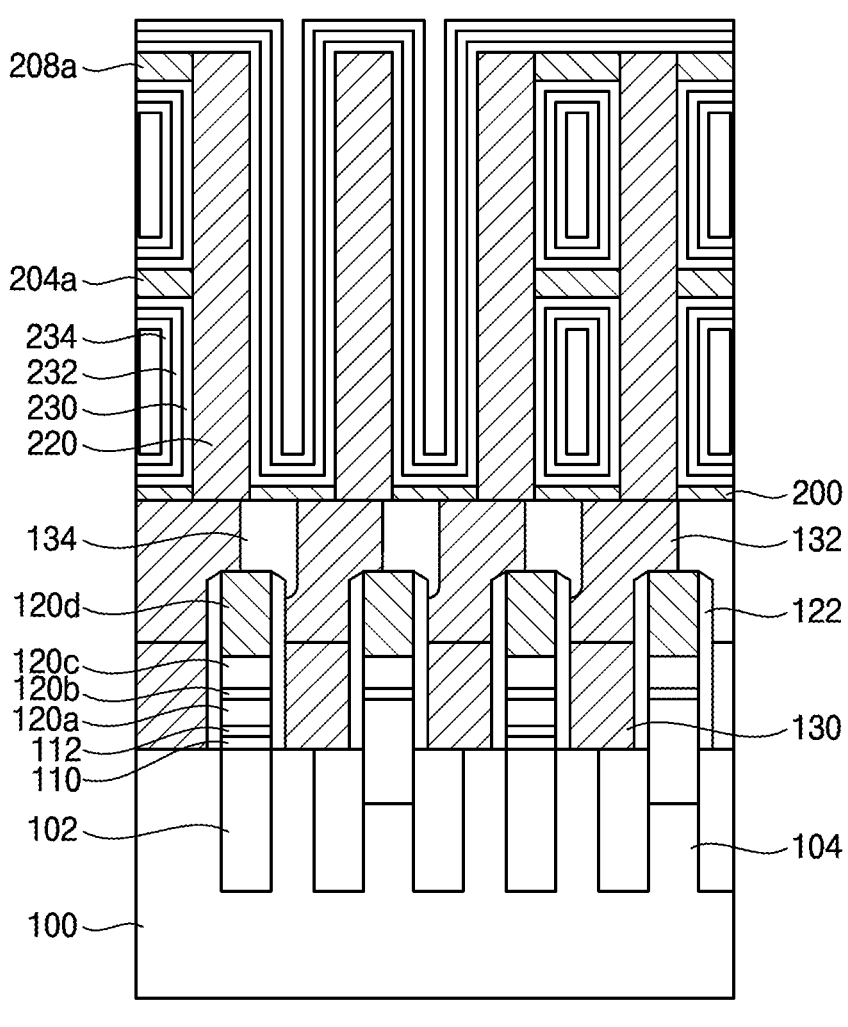
FIGS. 17 to 19 are sectional views of stages in a method of manufacturing a capacitor according to an exemplary embodiment.
Figure 18:
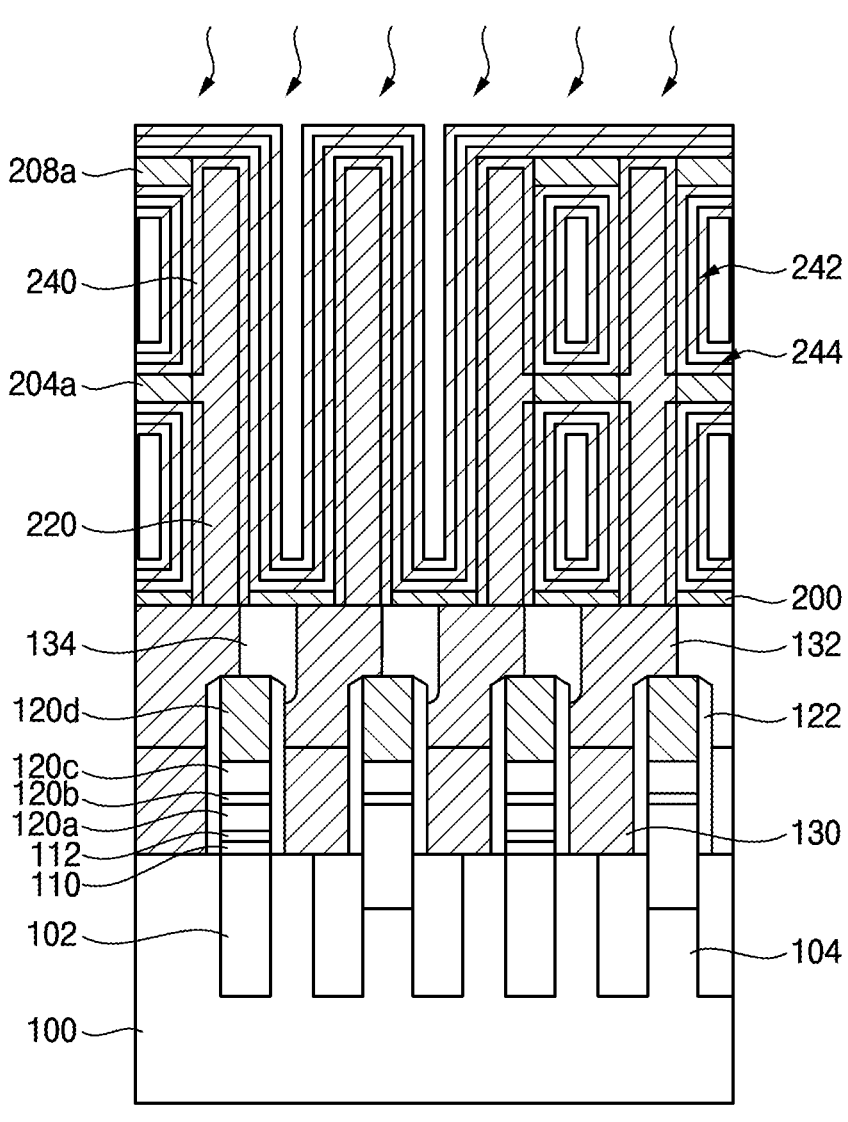
Figure 19:
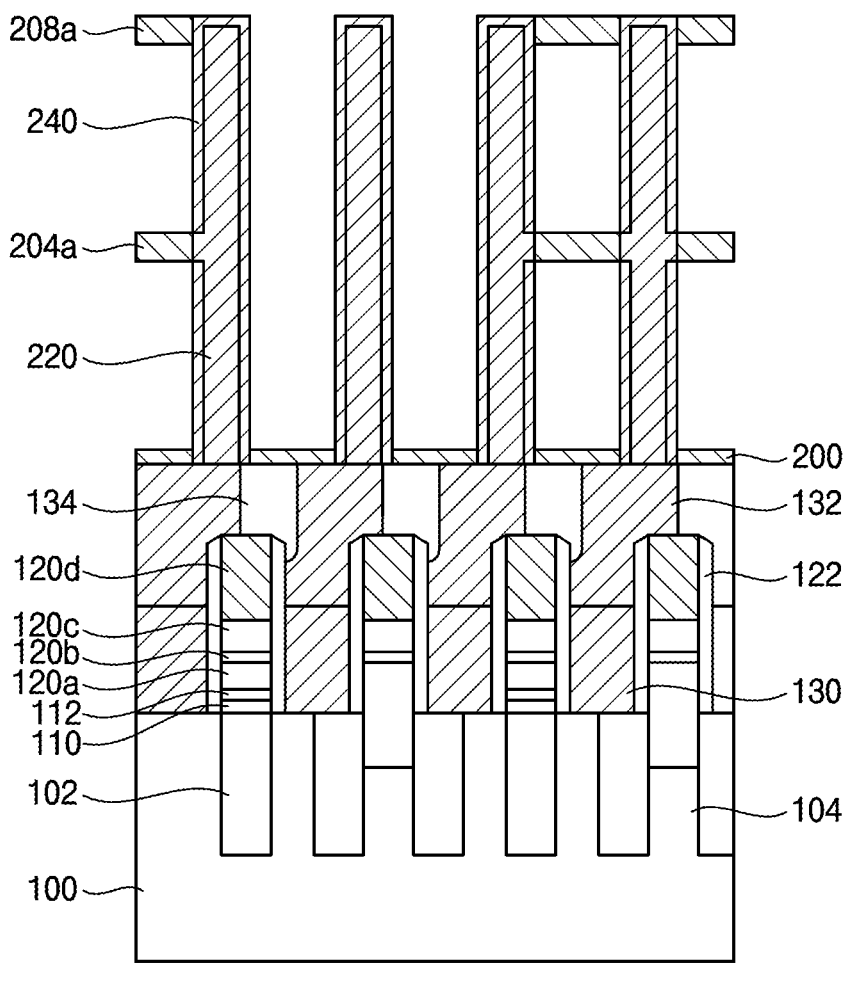

FIGS. 17 to 19 are sectional views of stage in a method of manufacturing a capacitor according to an exemplary embodiment. The method of manufacturing a capacitor that will be described below may include processes that are identical to the processes described with reference to FIGS. 6 to 16, except that a process of forming and diffusing a third interface layer may be further added.

Referring to FIG. 17, first, the processes described with reference to FIGS. 6 to 11 may be identically performed to form the structure shown in FIG. 11. Then, as described with reference to FIG. 12, after the second interface layer 232 is formed, a diffusion process for diffusing the second metal to the surfaces of the first interface layer 230 and the lower electrode 220 may be performed.

Although not shown, in the diffusion process, the second metal may be diffused onto the surface of the lower electrode 220 to partially form the first interface structure on the surface of the lower electrode 220. In some exemplary embodiments, the diffusion process may not be performed after the second interface layer 232 is formed.

Next, the third interface layer 234 may be formed on the second interface layer 232. The third interface layer 234 may be provided to increase an etching rate of the third interface structure to be formed in a subsequent process. Therefore, the third interface layer 234 may include substantially the same material as the first interface layer 230. According to the exemplary embodiment, the third interface layer 234 may include a titanium oxide.

The third interface layer 234 may have a thickness of less than 7 angstroms, e.g., a thickness of about 1 angstroms to about 7 angstroms. The third interface layer 234 may be formed by performing, e.g., an atomic layer deposition scheme, a chemical vapor deposition scheme, a physical vapor deposition scheme, an ion implantation scheme, or the like.

According to the exemplary embodiment, a sum of the thicknesses of the first to third interface layers 230, 232, and 234 may be less than 10 angstroms, e.g., a thickness of about 6 angstroms to about 10 angstroms. When the sum of the thicknesses of the first to third interface layers 230, 232, and 234 is thinner than 6 angstroms, an amount of the metal diffused to the surface of the lower electrode 220 may become small, and when the sum of the thicknesses of the first to third interface layers 230, 232, and 234 is thicker than 10 angstroms, a degree of integration of the capacitor may be reduced.

Referring to FIG. 18, after the third interface layer 234 is formed, a diffusion process for diffusing the second metal included in the second interface layer to the surfaces of the first interface layer 230 and the lower electrode 220 may be performed. The diffusion process may include, e.g., a plasma treatment process, a heat treatment process, an ultraviolet (UV) treatment process, and the like. The diffusion process may be substantially the same as the diffusion process described with reference to FIG. 12.

Through the diffusion process, the second metal (e.g., niobium) may be diffused to the surfaces of the first interface layer 230 and the lower electrode 220 so that the first interface structure 240 including at least the first metal and the second metal may be formed on the surface of the lower electrode 220. The first interface structure 240 may include the first metal, the first metal included in the first interface layer 230, the second metal, oxygen, and nitrogen.

In detail, as titanium, niobium, and oxygen included in the first to third interface layers 230, 232, and 234 diffuse to the surface of the lower electrode 220, the surface of the lower electrode 220 may be converted into the first interface structure 240 including titanium, niobium, nitrogen, and oxygen. In addition, as the second metal diffuses to the first interface layer 230, the first to third interface layers 230, 232, and 234 may be converted into the second interface structure 242 including titanium, niobium, oxygen, and nitrogen. Therefore, the first interface structure 240 and the second interface structure 242 may be formed on the lower electrode 220.

Meanwhile, the second interface layer 232 formed on the etch stop layer 200, the upper support layer pattern 208a, and the lower support layer pattern 204a may diffuse to the first interface layer 230, but may not further diffuse to a lower portion of the first interface layer 230. Therefore, the first and second interface layers 230 and 232 formed on the etch stop layer 200, the upper support layer pattern 208a, and the lower support layer pattern 204a may be converted into the third interface structure 244 including titanium, niobium, and oxygen. In other words, the third interface structure 244 may be formed on the etch stop layer 200, the upper support layer pattern 208a, and the lower support layer pattern 204a.

The concentration of the second metal in the first interface structure 240 may be greater than 10% (atomic %), e.g., about 10% to about 30%. The first interface structure 240 may have a thickness of about 5 angstroms to 15 angstroms, e.g., about 10 angstroms.

When the above process is performed, the same structure as described with reference to FIG. 12 may be formed.

Referring to FIG. 19, the third interface structure 244 may be removed through an isotropic etching process. The removal process may be the same as the removal process described with reference to FIGS. 12 and 13. Thereafter, the processes described with reference to FIGS. 15 and 16 may be identically performed to manufacture the DRAM element shown in FIG. 16.

Figure 20:
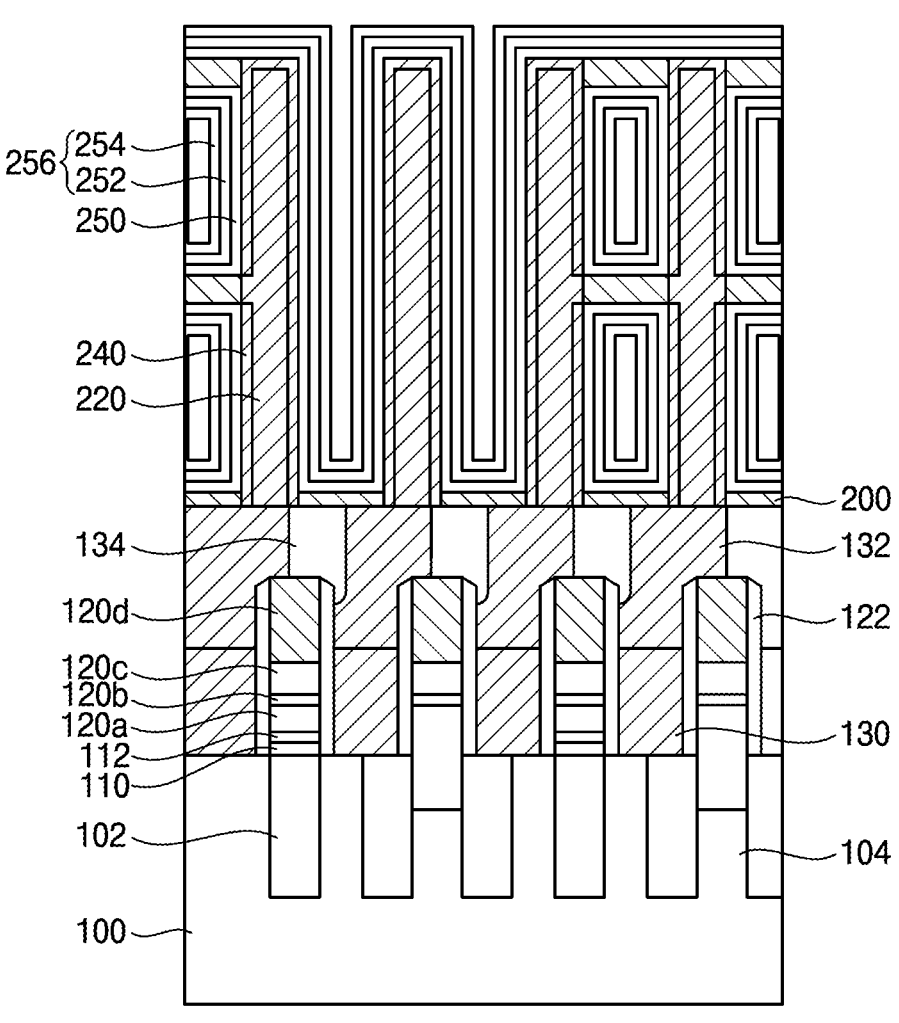
FIGS. 20 and 21 are sectional views of stages in a method of manufacturing a capacitor according to an exemplary embodiment.
Figure 21:
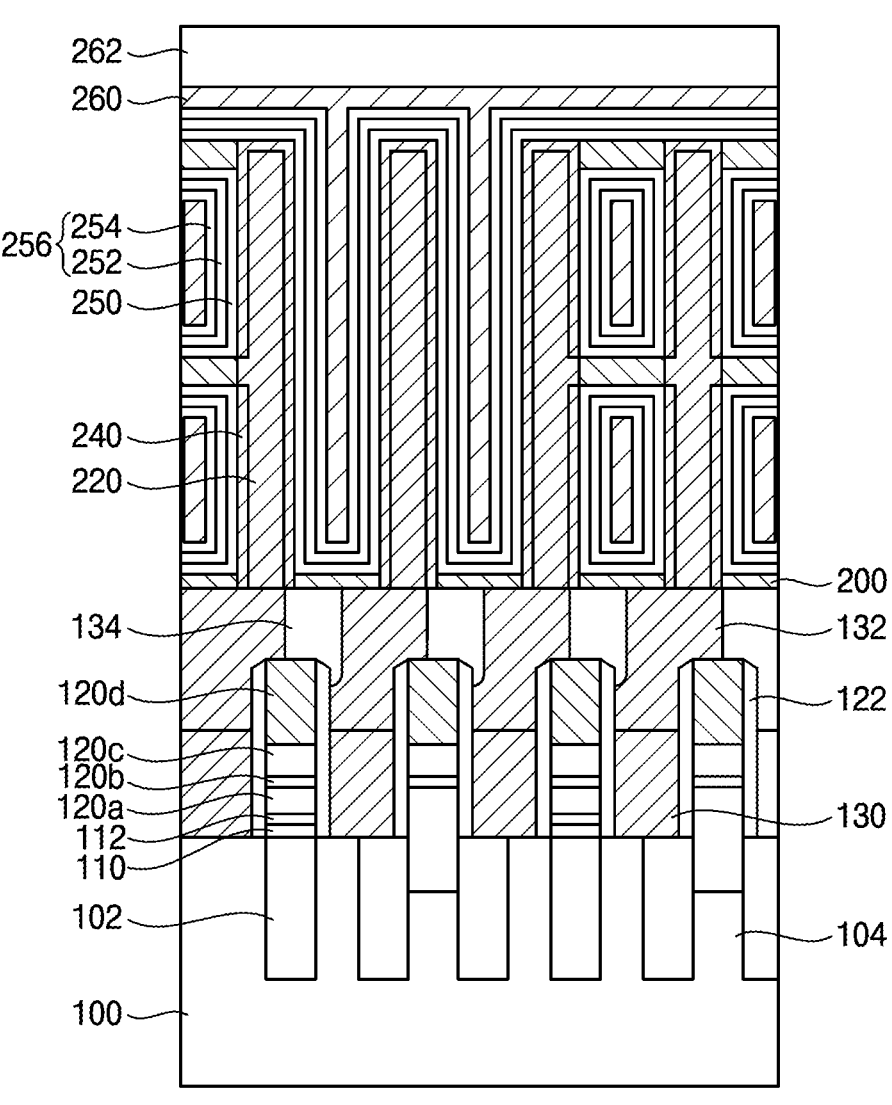

FIGS. 20 and 21 are sectional views of stages in a method of manufacturing a capacitor according to an exemplary embodiment. The method of manufacturing a capacitor that will be described below may include processes that are identical to the processes described with reference to FIGS. 6 to 16, except that a process of forming an upper interface structure may be further added.

Referring to FIG. 20, first, the processes described with reference to FIGS. 6 to 15 may be identically performed to form the structure shown in FIG. 15. Thereafter, a first upper interface layer 252 including a first metal oxide having conductivity and a second upper interface layer 254 including a second metal oxide may be formed on the dielectric layer 250 to form an upper interface structure 256.

At least one of the first and second upper interface layers 252 and 254 may include a metal that is different from a metal included in the upper electrode 260 that will be subsequently formed. The metal included in the at least one of the first and second upper interface layers 252 and 254 may include, e.g., niobium, tantalum, tungsten, cobalt, Sn, or indium.

According to the exemplary embodiment, the upper interface structure 256 may be formed by depositing a titanium oxide layer and a niobium oxide layer. In some exemplary embodiments, the upper interface structure 256 may be formed by depositing a niobium oxide layer and a titanium oxide layer. The upper interface structure 256 may have a thickness of about 5 angstroms to about 15 angstroms, e.g., about 10 angstroms.

Meanwhile, the diffusion process may not be performed after the upper interface structure 256 is formed.

Referring to FIG. 21, the upper electrode 260 and the plate electrode 262 may be formed on the upper interface structure 256. Therefore, the capacitor shown in FIG. 5A may be formed. Through the above process, a DRAM element may be manufactured.

Figure 22:
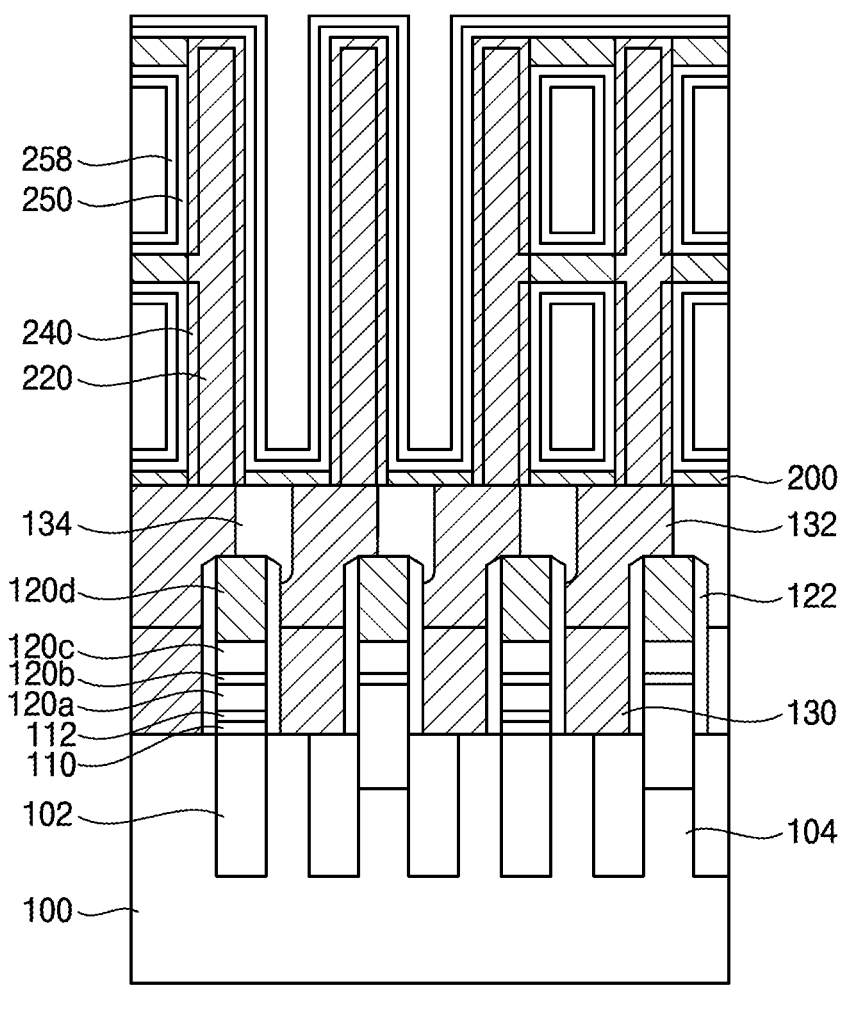
FIGS. 22 and 23 are sectional views of stages in a method of manufacturing a capacitor according to an exemplary embodiment.
Figure 23:
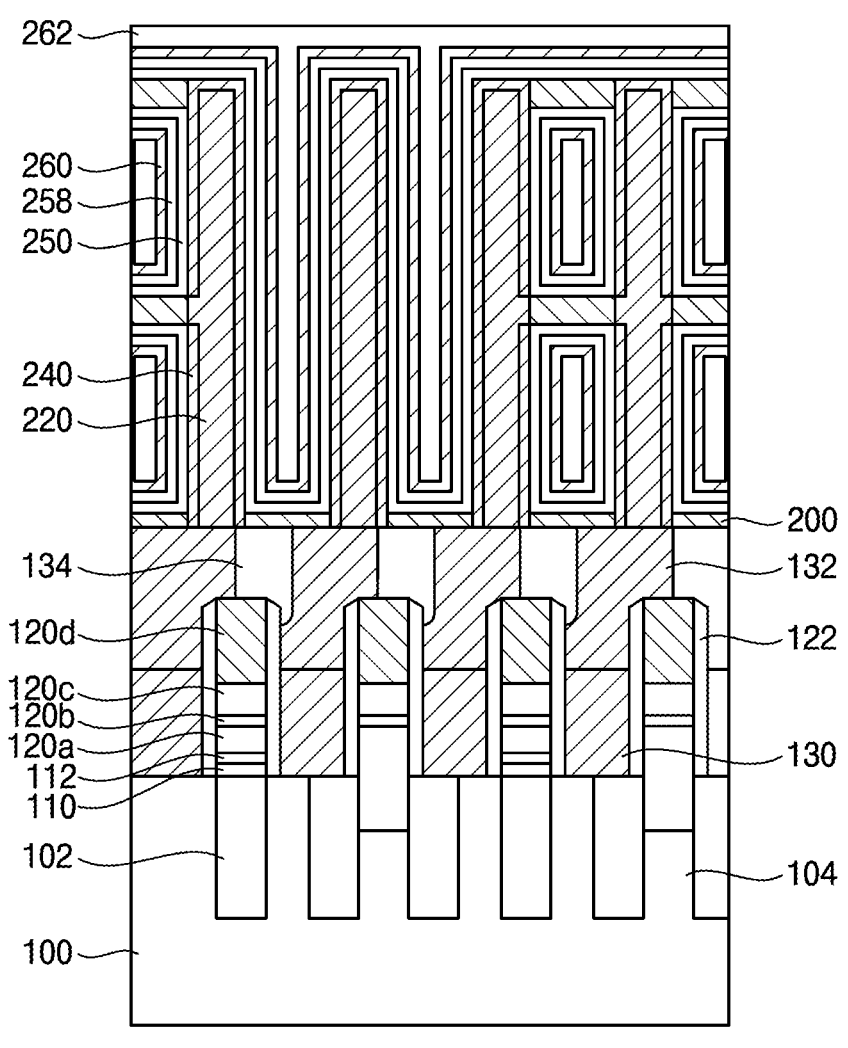

FIGS. 22 and 23 are sectional views of stages in a method of manufacturing a capacitor according to an exemplary embodiment. The method of manufacturing a capacitor that will be described below may include processes that are identical to the processes described with reference to FIGS. 6 to 16, except that a process of forming an upper interface layer may be further added.

Referring to FIG. 22, first, the processes described with reference to FIGS. 6 to 15 may be identically performed to form the structure shown in FIG. 15. Thereafter, an upper interface layer 258 including a first metal oxide having conductivity may be formed on the dielectric layer 250.

The upper interface layer 258 may include a metal that is different from the metal included in the upper electrode 260. The metal included in the upper interface layer 258 may include, e.g., niobium, tantalum, tungsten, cobalt, Sn, or indium.

According to the exemplary embodiment, the upper interface layer 258 may be formed by depositing a niobium oxide layer. The upper interface layer 258 may have a thickness of about 5 angstroms to about 15 angstroms, e.g., about 10 angstroms.

Meanwhile, the diffusion process may not be performed after the upper interface layer 258 is formed.

Referring to FIG. 23, the upper electrode 260 and the plate electrode 262 may be formed on the upper interface layer 258. Therefore, the capacitor shown in FIG. 5B may be formed. Through the above process, a DRAM element may be manufactured.

By way of summation and review, example embodiments provide a method of manufacturing a capacitor having a high capacitance and low leakage currents. Example embodiments provide a method of manufacturing a DRAM element including a capacitor having a high capacitance and low leakage currents.

That is, according to exemplary embodiments, a capacitor may include an interface structure including mutually different metals between the lower electrode and the dielectric layer. Therefore, the capacitor can have a high capacitance and low leakage currents. In addition, since the interface structure is not provided on the etch stop layer, a lower support layer pattern, and an upper support layer pattern, a bridge defect in which the lower electrodes are electrically connected to each other can be prevented or substantially reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a capacitor, the method comprising:

forming lower electrodes including a first metal;

forming a support layer pattern, which connects outer side walls of the lower electrodes to each other;

forming a first interface layer on the lower electrodes and the support layer pattern, the first interface layer including a first metal oxide having conductivity;

forming a second interface layer on the first interface layer, the second interface layer including a second metal oxide having conductivity;

diffusing a second metal included in the second interface layer through the first interface layer to the lower electrodes, such that a first interface structure is formed on surfaces of the lower electrodes and a second interface structure is formed on surfaces of the support layer pattern, the first interface structure and the second interface structure including at least the first metal and the second metal;

completely removing at least the second interface structure formed on the support layer pattern through an etching process;

forming a dielectric layer on the first interface structure and the support layer pattern; and forming an upper electrode on the dielectric layer.

2. The method as claimed in claim 1, wherein the first interface layer is formed of a material having a higher etching rate than a material of the second interface layer in a same etching process.

3. The method as claimed in claim 1, wherein the second metal in the second interface layer is formed of niobium, tantalum, tungsten, cobalt, Sn, or indium.

4. The method as claimed in claim 1, wherein the first interface layer is formed of titanium oxide, and the second interface layer is formed of niobium oxide.

5. The method as claimed in claim 4, wherein each of the lower electrodes is formed of a titanium nitride, and the first interface structure is formed of a material including titanium, niobium, oxygen, and nitrogen.

6. The method as claimed in claim 1, wherein:

each of the first interface layer and the second interface layer is formed to have a thickness of 3 angstroms to 7 angstroms, and a sum of the thickness of the first interface layer and the thickness of the second interface layer is less than 10 angstroms.

7. The method as claimed in claim 1, wherein the first interface structure is formed such that a concentration of the second metal included in the first interface structure is 10% to 30%.

8. The method as claimed in claim 1, wherein the first interface structure is formed to have a thickness of 5 angstroms to 15 angstroms.

9. The method as claimed in claim 1, wherein the dielectric layer is formed of at least one of $HfO_2$, $ZrO_2$, $TiO_2$, $Ta_2O_3$, and $La_2O_3$.

10. The method as claimed in claim 1, wherein diffusing of the second metal includes performing a plasma treatment process, a heat treatment process, or an ultraviolet (UV) treatment process.

11. The method as claimed in claim 1, further comprising forming a third interface layer on the second interface layer, the third interface layer including a same material as the first interface layer.

12. The method as claimed in claim 1, further comprising forming an upper interface layer, after forming the dielectric layer, the upper interface layer including the first metal oxide.

13. The method as claimed in claim 1, further comprising, before forming the lower electrodes, forming an etch stop layer, wherein:

the lower electrodes are formed such that lower portions of the lower electrodes extend through the etch stop layer, and the second interface structure formed on the etch stop layer is completely removed in the etching process during removing of the second interface structure.

14. A method of manufacturing a capacitor, the method comprising:

forming a lower structure on a substrate;

forming an etch stop layer on the lower structure;

forming a lower electrode including a first metal on the lower structure, such that the lower electrode extends through the etch stop layer;

forming a first interface layer including a first metal oxide having conductivity on the lower electrode and the etch stop layer;

forming a second interface layer including a second metal oxide having conductivity on the first interface layer;

diffusing a second metal included in the second interface layer to the lower electrodes to form a first interface structure including at least the first metal and the second metal on surfaces of the lower electrodes, the first interface layer and the second interface layer being converted into a second interface structure on the etch stop layer;

completely removing at least the second interface structure from the etch stop layer through an etching process;

forming a dielectric layer on the first interface structure and the etch stop layer; and forming an upper electrode on the dielectric layer.

15. The method as claimed in claim 14, wherein the second metal in the second interface layer includes niobium, tantalum, tungsten, cobalt, Sn, or indium.

16. The method as claimed in claim 14, wherein the first interface layer includes a titanium oxide, and the second interface layer includes a niobium oxide.

17. The method as claimed in claim 16, wherein the lower electrode includes a titanium nitride, and the first interface structure includes a material including titanium, niobium, oxygen, and nitrogen.

18. A method of manufacturing a dynamic random access memory (DRAM) element, the method comprising:

forming bit line structures on a substrate;

forming contact structures on the substrate;

forming an etch stop layer on the contact structures;

forming lower electrodes including a first metal on the contact structures, respectively, the lower electrodes extending through the etch stop layer to contact the contact structures;

forming an interface layer having a stacked structure of at least a titanium oxide layer and a niobium oxide layer on the lower electrodes and the etch stop layer;

diffusing niobium included in the interface layer to the lower electrodes to form a first interface structure including at least titanium and the niobium on surfaces of the lower electrodes and a second interface structure on the etch stop layer;

completely removing at least the second interface structure from the etch stop layer through an etching process;

forming a dielectric layer on the first interface structure and the etch stop layer; and forming an upper electrode on the dielectric layer.

19. The method as claimed in claim 18, further comprising, after forming the lower electrodes, forming a support layer pattern connecting outer side walls of the lower electrodes to each other, such that the second interface structure is formed on the support layer pattern and, subsequently, completely removed during removing of the second interface structure.

20. The method as claimed in claim 18, further comprising forming an additional titanium oxide layer on the niobium oxide layer during forming of the interface layer.

* * * * *